(12) United States Patent
Nakazawa

(10) Patent No.: US 9,035,298 B2
(45) Date of Patent: May 19, 2015

(54) SEMICONDUCTOR DEVICE, TFT SUBSTRATE, AND METHOD FOR MANUFACTURING SEMICONDUCTOR DEVICE AND TFT SUBSTRATE

(75) Inventor: Makoto Nakazawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/990,531

(22) PCT Filed: Nov. 28, 2011

(86) PCT No.: PCT/JP2011/077322
§ 371 (c)(1),
(2), (4) Date: May 30, 2013

(87) PCT Pub. No.: WO2012/073862
PCT Pub. Date: Jun. 7, 2012

(65) Prior Publication Data
US 2013/0248856 A1 Sep. 26, 2013

(30) Foreign Application Priority Data
Dec. 1, 2010 (JP) ................................ 2010-268833

(51) Int. Cl.
*H01L 27/12* (2006.01)
*H01L 29/786* (2006.01)
*G02F 1/1362* (2006.01)

(52) U.S. Cl.
CPC *H01L 27/1288* (2013.01); *G02F 2001/136295* (2013.01); *H01L 27/1225* (2013.01); *H01L 29/7869* (2013.01); *H01L 27/1255* (2013.01); *G02F 1/136213* (2013.01)

(58) Field of Classification Search
CPC ............ H01L 27/1225; H01L 27/3265; H01L 27/1214; H01L 27/1251; H01L 27/1255; H01L 29/7869; G02F 1/136213

USPC ................................ 257/43, 59, 72; 438/104
See application file for complete search history.

(56) References Cited

U.S. PATENT DOCUMENTS 7,772,021 B2 * 8/2010 Lee et al. ........................ 438/30
8,237,162 B2 * 8/2012 Arai ................................ 257/59
(Continued)

FOREIGN PATENT DOCUMENTS

JP 2008-170664 A 7/2008
JP 2010-098305 A 4/2010
(Continued)

OTHER PUBLICATIONS

English translation of Official Communication issued in corresponding International Application PCT/JP2011/077322, mailed on Jun. 13, 2013.
(Continued)

*Primary Examiner* — Khiem D Nguyen
*Assistant Examiner* — Pauline Vu
(74) *Attorney, Agent, or Firm* — Keating & Bennett, LLP

(57) ABSTRACT

A semiconductor device (100) according to the present invention is a semiconductor device having a thin film transistor (10), including: a gate electrode (12) of a thin film transistor (10); a gate insulating layer (13) formed on the gate electrode (12); an oxide semiconductor layer (15) disposed on the gate insulating layer (13); and a source electrode (17) and a drain electrode (18) formed on the oxide semiconductor layer (15). When viewed from a direction perpendicular to the substrate plane the semiconductor device (100), the source electrode (17) or the drain electrode (18) covers at least one of a plurality of sites at which the perimeter of the gate electrode (12) and the perimeter of the oxide semiconductor layer (15) intersect.

26 Claims, 12 Drawing Sheets

(56) References Cited

U.S. PATENT DOCUMENTS

| | | | |
|---|---|---|---|
| 2002/0014624 A1* | 2/2002 | Yamazaki et al. | 257/57 |
| 2008/0119018 A1* | 5/2008 | Toyota et al. | 438/164 |
| 2009/0160741 A1* | 6/2009 | Inoue et al. | 345/76 |
| 2009/0174835 A1* | 7/2009 | Lee et al. | 349/46 |
| 2010/0051941 A1* | 3/2010 | Tanaka | 257/43 |
| 2010/0072468 A1 | 3/2010 | Yamazaki et al. | |
| 2010/0084652 A1 | 4/2010 | Yamazaki et al. | |
| 2010/0109004 A1* | 5/2010 | Arai | 257/43 |
| 2010/0140613 A1* | 6/2010 | Kimura | 257/43 |
| 2010/0163865 A1* | 7/2010 | Arai | 257/43 |
| 2010/0244021 A1* | 9/2010 | Uochi et al. | 257/43 |
| 2010/0289832 A1 | 11/2010 | Yamamoto et al. | |
| 2011/0049510 A1* | 3/2011 | Yamazaki et al. | 257/43 |
| 2011/0104833 A1* | 5/2011 | Kang et al. | 438/23 |
| 2011/0220888 A1* | 9/2011 | Choi et al. | 257/43 |

FOREIGN PATENT DOCUMENTS

| | | | | |
|---|---|---|---|---|
| JP | 2010-107977 A | | 5/2010 | |
| JP | 2010-245118 A | | 10/2010 | |
| JP | 2010243594 A | * | 10/2010 | G02F 1/1368 |
| JP | 2010-266490 A | | 11/2010 | |
| JP | 2011-216721 A | | 10/2011 | |

OTHER PUBLICATIONS

Official Communication issued in International Patent Application No. PCT/JP2011/077322, mailed on Feb. 28, 2012.

* cited by examiner (a)

(b)

(a)

(b)

(a)

(b)

(c)

(a)

(b)

(c)

US 9,035,298 B2

SEMICONDUCTOR DEVICE, TFT SUBSTRATE, AND METHOD FOR MANUFACTURING SEMICONDUCTOR DEVICE AND TFT SUBSTRATE

TECHNICAL FIELD

The present invention relates to a semiconductor device and TFT substrate (e.g., of a display device) having a thin film transistor, and a production method for a semiconductor device and TFT substrate having a thin film transistor.

BACKGROUND ART

Generally speaking, a liquid crystal display device or an organic EL (Electro Luminescence) display device of an active matrix type includes: a substrate on which a thin film transistor (Thin Film Transistor; hereinafter also referred to as "TFT") is formed as a switching element for each pixel (hereinafter also referred to as "TFT substrate"); a counter substrate on which a counter electrode, color filters, and the like are formed; and an optical modulation layer, e.g., a liquid crystal layer, provided between the TFT substrate and the counter substrate.

On the TFT substrate, a plurality of source lines, a plurality of gate lines, and a plurality of TFTs respectively disposed at intersections therebetween, pixel electrodes for applying a voltage across the optical modulation layer such as a liquid crystal layer, storage capacitor lines and storage capacitor electrodes, and the like are formed.

The construction of a TFT substrate is disclosed in Patent Document 1, for example. Hereinafter, with reference to the drawings, the construction of a TFT substrate disclosed in Patent Document 1 will be described.

FIG. 12(a) is a schematic plan view showing the TFT substrate in outline, and the FIG. 12(b) is an enlarged plan view showing one pixel of the TFT substrate. FIG. 13 is a cross-sectional view of a TFT and terminal portions of the TFT substrate shown in FIG. 12.

As shown in FIG. 12(a), the TFT substrate includes a plurality of gate lines 2016 and a plurality of source lines 2017. Each region 2021 surrounded by these lines 2016 and 2017 defines a "pixel". In a region 2040 of the TFT substrate other than the region (displaying region) where the pixels are formed, a plurality of connecting portions 2041 for allowing the plurality of gate lines 2016 and source lines 2017 to be respectively connected to a driving circuit are provided. Each connecting portion 2041 constitutes a terminal portion for providing connection to external wiring.

As shown in FIG. 12(b) and FIG. 13, a pixel electrode 2020 is provided so as to cover each region 2021 defining a pixel. Moreover, a TFT is formed in each region 2021. The TFT includes a gate electrode G, gate insulating films 2025 and 2026 covering the gate electrode G, a semiconductor layer 2019 disposed on the gate insulating film 2026, and a source electrode S and a drain electrode D respectively connected to both end portions of the semiconductor layer 2019. The TFT is covered by a protection film 2028. An interlayer insulating film 2029 is formed between the protection film 2028 and the pixel electrode 2020. The source electrode S of the TFT is connected to a source line 2017, whereas the gate electrode G is connected to a gate line 2016. The drain electrode D is connected to the pixel electrode 2020 within a contact hole 2030.

Moreover, a storage capacitor line 2018 is formed in parallel to the gate line 2016. The storage capacitor line 2018 is connected to a storage capacitor. Herein, the storage capacitor is composed of a storage capacitor electrode 2018b which is made of the same conductive film as the drain electrode D, a storage capacitor electrode 2018a which is made of the same conductive film as the gate line 2016, and the gate insulating film 2026 interposed therebetween.

On the connecting portion 2041 extending from each gate line 2016 or source line 2017, the gate insulating films 2025 and 2026 and the protection film 2028 are not formed, but a connection line 2044 is formed so as to be in contact with an upper face of the connecting portion 2041. As a result, electrical connection between the connecting portion 2041 and the connection line 2044 is ensured.

As shown in FIG. 13, in the liquid crystal display device, the TFT substrate is disposed so as to oppose a substrate 2014 on which a counter electrode and color filters are formed, with a liquid crystal layer 2015 interposed therebetween.

In the recent years, it has been proposed to form a channel layer of a TFT by using an oxide semiconductor such as IGZO ($InGaZnO_x$), instead of a silicon semiconductor film. Such a TFT is referred to as an "oxide semiconductor TFT". An oxide semiconductor has higher mobility than does amorphous silicon. Therefore, an oxide semiconductor TFT is able to operate more rapidly than an amorphous silicon TFT. Moreover, an oxide semiconductor film is formed through simpler processes than those of a polycrystalline silicon film, and therefore is also applicable to devices which require a large area.

Patent Document 2 describes a TFT substrate having oxide semiconductor TFTs. In FIG. 4 and the like of this document, an oxide semiconductor TFT construction for use as a protection circuit of a display device is described.

CITATION LIST

Patent Literature

[Patent Document 1] Japanese Laid-Open Patent Publication No. 2008-170664
[Patent Document 2] Japanese Laid-Open Patent Publication No. 2010-107977

SUMMARY OF INVENTION

Technical Problem

FIG. 14 is a plan view showing an oxide semiconductor TFT 3010 of a similar structure to that shown in FIG. 4 of Patent Document 2.

As shown in FIG. 14, the oxide semiconductor TFT 3010 includes a gate electrode 3012, an oxide semiconductor layer 3015 disposed on the gate electrode 3012, and a source electrode 3017 and a drain electrode 3018 disposed so as to overlie the oxide semiconductor layer 3015. When viewed from a direction perpendicular to the substrate plane of the TFT substrate, in each of four sites at which the perimeter of the gate electrode 3012 and the perimeter of the oxide semiconductor layer 3015 intersect (near the middle of each portion indicated as IS in the figure: hereinafter referred to as an "IS portion"), the oxide semiconductor layer 3015 is not covered by the source electrode 3017 or the drain electrode 3018.

The inventors have studied the production process of the oxide semiconductor TFT 3010 of this structure to find that, in an etching step of the source electrode 3017 and the drain electrode 3018, the oxide semiconductor layer 3015 that lies under them is damaged by the etchant. Such a problem has never occurred when using a semiconductor layer such as amorphous silicon. Hereinafter, this problem will be described with reference to FIG. 15 and FIG. 16.

FIG. 15 is a plan view schematically showing the construction of the TFT 3010. FIG. 16(a) shows the construction in an A-A' cross section in FIG. 15; FIG. 16(b) shows the construction in a B-B' cross section; and FIG. 16(c) shows the construction in a C-C' cross section.

When forming a channel portion of the TFT 3010, usually, a metal layer is first formed on the oxide semiconductor layer 3015, and thereafter the metal layer is patterned by an etching technique including wet etching treatment, thereby forming the source electrode 3017 and the drain electrode 3018. In this wet etching treatment, a problem occurs in that the etchant seeps into each site where the perimeter of the gate electrode 3012 and the perimeter of the oxide semiconductor layer 3015 intersect, thus allowing the oxide semiconductor layer 3015 to be also etched, and causing an erosion in the oxide semiconductor layer 3015 as indicated at SE in FIG. 15.

For example, in the case of forming the source electrode 3017 and the drain electrode 3018 by etching a two-layer construction of metal layers obtained by stacking an aluminum (Al) layer on a titanium (Ti) layer, first, the upper aluminum layer is subjected to wet etching by using a liquid mixture of acetic acid, phosphoric acid, and nitric acid, and thereafter the titanium layer is removed by dry etching. At this time, a stepped portion emerges between a gate insulating layer 3013, the oxide semiconductor layer 3015, and the titanium layer near the perimeter of the gate electrode 3012, and the etchant seeps into the titanium layer near this stepped portion during the wet etching, thus resulting in a problem of allowing the underlying oxide semiconductor layer 3015 to be etched. This is considered to be because etchant residues are likely to remain near the stepped portion of the oxide semiconductor layer 3015 above the edge of the gate electrode 3012, such that the etchant seeps from the stepped portion to damage the oxide semiconductor layer 3015.

This etching of the oxide semiconductor layer 3015 is described with reference to FIG. 16. First, FIG. 16(a) shows the construction of the A-A' cross section passing through the middle of the oxide semiconductor layer 3015 along the longitudinal direction of the source electrode 3017 and the drain electrode 3018. This portion exhibits a multilayer structure of the gate electrode 3012, the gate insulating layer 3013, the oxide semiconductor layer 3015, the source electrode 3017 (a titanium layer 3017A and an aluminum layer 3017B), the drain electrode 3018 (a titanium layer 3018A and an aluminum layer 3018B), and a passivation layer 3019. However, since this portion is distant from the IS portion shown in FIG. 14, no erosion due to etching of the oxide semiconductor layer 3015 is observed.

FIG. 16(b) shows the construction of the B-B' cross section passing through a position near the edge of the oxide semiconductor layer 3015. Although this portion should ideally have the same construction as the construction of the A-A' cross section, it exhibits an erosion SE caused by unwanted etching of the oxide semiconductor layer 3015, because of being close to the IS portion. The passivation layer 3019 goes into the erosion SE at the channel portion, while the erosion SE under the source electrode 3017 becomes a void.

FIG. 16(c) shows the construction of the C-C' cross section passing near the IS portion. This is not a portion where the source electrode 3017 and the drain electrode 3018 are to be finally formed. This portion has a multilayer structure of the gate electrode 3012, the gate insulating layer 3013, the oxide semiconductor layer 3015, and the passivation layer 3019. However, since this portion is close to the IS portion, a large part of the oxide semiconductor layer 3015 over the gate electrode 3012 has been removed through etching. The passivation layer 3019 has gone into the erosion SE of the oxide semiconductor layer 3015.

Thus, it has been found that etchant is likely to remain at the stepped portion of layers above the perimeter of the gate electrode 3012, and that, in this portion, etchant is likely to seep into the oxide semiconductor layer 3015 via the titanium layer 3017A, which is the lower layer of the source electrode 3017 and the drain electrode 3018. This causes erosion of the oxide semiconductor layer 3015 and delamination of the source electrode 3017 and the drain electrode 3018, thus inducing deteriorations in TFT characteristics.

In the case of a TFT in which amorphous silicon is used for the semiconductor layer, if etchant seeping occurs, the amorphous silicon layer is less likely to be etched over a short time than a titanium layer, thus not creating a problem. However, in a TFT in which an oxide semiconductor layer is used, the rapid etching rate of the oxide semiconductor causes the aforementioned problems, thus making it difficult to adopt a production method which is similar to that of an amorphous silicon TFT for purposes of simplification of production steps or the like.

Next, with reference to FIGS. 17(a) to (c), a relationship between the material of the lower layers of the source electrode 3017 and the drain electrode 3018, their film thickness, and a rate of TFT defects, as studied by the inventors of the present invention, will be described.

FIG. 17(a) shows planar micrographs of the TFT portion, whose thickness was varied among 30 nm, 60 nm, 100 nm, respectively, where titanium (upper 3 photographs: Ti) or a material obtained by doping titanium with nitrogen (lower 3 photographs: TiN) was used for the lower layers of the source electrode 3017 and the drain electrode 3018. The aforementioned IS portion is indicated by dotted lines in the figure. FIG. 17(b) shows defect rates in the cases where the TFT is fabricated under conditions corresponding to the six photographs in FIG. 17(a) (EL; number of samples: 300). FIG. 17(c) is a TFT cross-sectional photograph near the stepped portion IS. In this study, an aluminum layer having a thickness of 150 nm was used as the upper layers of the source electrode 3017 and the drain electrode 3018.

As can be seen from FIG. 17(b), in the case where titanium with a film thickness of 30 nm is used as the lower layer, the defect rate EL is 90% or more, indicative of a very low TFT reliability. Although the defect rate EL decreases as the film thickness is increased to 60 nm and 100 nm, sufficient reliability is not obtained. Moreover, increasing the film thickness results in an increased material cost and a longer etching time, thus resulting in a problem of lower production efficiency. A problem may also arise in that the etching depth may become nonuniform, causing variations in TFT characteristics.

In the cases where the lower layer material was replaced by a metal obtained by doping titanium with nitrogen, the defect rate EL at the film thickness of 30 nm was hardly improved. Moreover, the defect rate EL was hardly improved even when the film thickness was increased to 60 nm and 100 nm. Furthermore, if the edge slope of the gate electrode 3012 has a steep gradient, a stepped portion with a steep slope will also form on the overlying layers, thus inducing a problem in that etchant may seep into the titanium layer or remain at the stepped portion to further erode the oxide semiconductor layer 3015.

The present invention has been made in view of the above, and aims to produce a semiconductor device having excellent TFT characteristics with a good production efficiency, by reducing damage to an oxide semiconductor layer that occurs during the production of an oxide semiconductor TFT or an electrical element having an oxide semiconductor. The present invention also aims to produce a display device having such a TFT or the like, with a high performance and good production efficiency.

Solution to Problem

A semiconductor device according to the present invention is a semiconductor device having a thin film transistor, comprising: a gate electrode of the thin film transistor; a gate insulating layer formed on the gate electrode; an oxide semiconductor layer of the thin film transistor, the oxide semiconductor layer being disposed on the gate insulating layer; and a source electrode and a drain electrode of the thin film transistor, the source electrode and the drain electrode being formed on the oxide semiconductor layer, wherein, when viewed from a direction perpendicular to a substrate plane of the semiconductor device, the source electrode or the drain electrode covers at least one of a plurality of sites at which a perimeter of the gate electrode and a perimeter of the oxide semiconductor layer intersect.

In one embodiment, when viewed from a direction perpendicular to a substrate plane of the semiconductor device, the source electrode and the drain electrode cover all of the plurality of sites at which the perimeter of the gate electrode and the perimeter of the oxide semiconductor layer intersect.

Another semiconductor device according to the present invention is a semiconductor device having a thin film transistor, comprising: a gate electrode of the thin film transistor; a gate insulating layer formed on the gate electrode; an oxide semiconductor layer of the thin film transistor, the oxide semiconductor layer being disposed on the gate insulating layer; and a source electrode and a drain electrode of the thin film transistor, the source electrode and the drain electrode being formed on the oxide semiconductor layer, wherein, when viewed from a direction perpendicular to a substrate plane of the semiconductor device, the oxide semiconductor layer is formed inside a perimeter of the gate electrode, without intersecting the perimeter of the gate electrode.

In one embodiment, the source electrode and the drain electrode include a layer of aluminum.

In one embodiment, the source electrode and the drain electrode include a first layer of titanium and a second layer of aluminum, the second layer being formed on the first layer.

A TFT substrate according to the present invention is a TFT substrate of a display device having a thin film transistor and a storage capacitor disposed corresponding to a pixel, comprising: a storage capacitor electrode of the storage capacitor; an insulating layer formed on the storage capacitor electrode; an oxide semiconductor layer disposed on the insulating layer; and a storage capacitor counter electrode of the storage capacitor, the storage capacitor counter electrode being formed on the oxide semiconductor layer, wherein, when viewed from a direction perpendicular to a substrate plane of the TFT substrate, the storage capacitor counter electrode covers at least one of a plurality of sites at which a perimeter of the storage capacitor electrode and a perimeter of the oxide semiconductor layer intersect.

Another TFT substrate according to the present invention is a TFT substrate of a display device having a thin film transistor and a storage capacitor disposed corresponding to a pixel, comprising: a storage capacitor electrode of the storage capacitor; an insulating layer formed on the storage capacitor electrode; an oxide semiconductor layer disposed on the insulating layer; and a storage capacitor counter electrode of the storage capacitor, the storage capacitor counter electrode being formed on the oxide semiconductor layer, wherein, when viewed from a direction perpendicular to a substrate plane of the TFT substrate, the oxide semiconductor layer is formed inside a perimeter of the storage capacitor electrode, without intersecting the perimeter of the storage capacitor electrode.

In one embodiment, the TFT substrate comprises: a gate electrode of the thin film transistor; a gate insulating layer formed on the gate electrode; an oxide semiconductor layer of the thin film transistor, the oxide semiconductor layer being disposed on the gate insulating layer; and a source electrode and a drain electrode of the thin film transistor, the source electrode and the drain electrode being formed on the oxide semiconductor layer of the thin film transistor, wherein, when viewed from a direction perpendicular to a substrate plane of the TFT substrate, the source electrode or the drain electrode covers at least one of a plurality of sites at which a perimeter of the gate electrode and a perimeter of the oxide semiconductor layer of the thin film transistor intersect.

In one embodiment, the TFT substrate comprises: a gate electrode of the thin film transistor; a gate insulating layer formed on the gate electrode; an oxide semiconductor layer of the thin film transistor, the oxide semiconductor layer being disposed on the gate insulating layer; and a source electrode and a drain electrode of the thin film transistor, the source electrode and the drain electrode being formed on the oxide semiconductor layer of the thin film transistor, wherein, when viewed from a direction perpendicular to a substrate plane of the TFT substrate, the oxide semiconductor layer of the thin film transistor is formed inside a perimeter of the gate electrode, without intersecting the perimeter of the gate electrode.

In one embodiment, the storage capacitor counter electrode includes a layer of aluminum.

Another TFT substrate according to the present invention is a TFT substrate of a display device having a displaying region which includes a pixel having a thin film transistor, and a peripheral region formed outside the displaying region, the peripheral region including an electrical element, wherein, the electrical element includes a gate electrode, an insulating layer formed on the gate electrode, an oxide semiconductor layer of the electrical element, the oxide semiconductor layer being disposed on the insulating layer, and a source electrode and a drain electrode formed on the oxide semiconductor layer; and when viewed from a direction perpendicular to a substrate plane of the TFT substrate, the source electrode or the drain electrode covers at least one of a plurality of sites at which a perimeter of the gate electrode and a perimeter of the oxide semiconductor layer intersect.

Another TFT substrate according to the present invention is a TFT substrate of a display device having a displaying region which includes a pixel having a thin film transistor, and a peripheral region formed outside the displaying region, the peripheral region including an electrical element, wherein, the electrical element includes a gate electrode, an insulating layer formed on the gate electrode, an oxide semiconductor layer of the electrical element, the oxide semiconductor layer being disposed on the insulating layer, and a source electrode and a drain electrode formed on the oxide semiconductor layer; and when viewed from a direction perpendicular to a substrate plane of the TFT substrate, the oxide semiconductor layer is formed inside a perimeter of the gate electrode, without intersecting the perimeter of the gate electrode.

In one embodiment, the TFT substrate comprises: a gate electrode of the thin film transistor; the gate insulating layer formed on the gate electrode; an oxide semiconductor layer of the thin film transistor, the oxide semiconductor layer being disposed on the gate insulating layer; and a source electrode and a drain electrode of the thin film transistor, the source electrode and the drain electrode being formed on the oxide semiconductor layer of the thin film transistor, wherein, when viewed from a direction perpendicular to a substrate plane of the TFT substrate, the source electrode or the drain electrode of the thin film transistor covers at least one of a plurality of sites at which the perimeter of the gate electrode of the thin film transistor and the perimeter of the oxide semiconductor layer of the thin film transistor intersect.

In one embodiment, the TFT substrate comprises: a gate electrode of the thin film transistor; the gate insulating layer formed on the gate electrode; an oxide semiconductor layer of the thin film transistor, the oxide semiconductor layer being disposed on the gate insulating layer; and a source electrode and a drain electrode of the thin film transistor, the source electrode and the drain electrode being formed on the oxide semiconductor layer of the thin film transistor, wherein, when viewed from a direction perpendicular to a substrate plane of the TFT substrate, the oxide semiconductor layer of the thin film transistor is formed inside the perimeter of the gate electrode of the thin film transistor, without intersecting the perimeter of the gate electrode of the thin film transistor.

In one embodiment, the source electrode and the drain electrode of the electrical element include a layer of aluminum.

A production method for a semiconductor device according to the present invention is a production method for a semiconductor device having a thin film transistor, comprising: (A) a step of forming a gate electrode of the thin film transistor on a substrate; (B) a step of forming a gate insulating layer so as to cover the gate electrode; (C) a step of forming an oxide semiconductor layer of the thin film transistor on the gate insulating layer; and (D) a step of forming a source electrode and a drain electrode of the thin film transistor on the oxide semiconductor layer, wherein, when viewed from a direction perpendicular to a substrate plane of the semiconductor device, the source electrode or the drain electrode is formed so as to cover at least one of a plurality of sites at which a perimeter of the gate electrode and a perimeter of the oxide semiconductor layer intersect.

In one embodiment, when viewed from a direction perpendicular to a substrate plane of the semiconductor device, the source electrode and the drain electrode is formed so as to cover all of the plurality of sites at which the perimeter of the gate electrode and the oxide semiconductor layer intersect.

Another production method for a semiconductor device according to the present invention is a production method for a semiconductor device having a thin film transistor, comprising: (A) a step of forming a gate electrode of the thin film transistor on a substrate; (B) a step of forming a gate insulating layer so as to cover the gate electrode; (C) a step of forming an oxide semiconductor layer of the thin film transistor on the gate insulating layer; and (D) a step of forming a source electrode and a drain electrode of the thin film transistor on the oxide semiconductor layer, wherein, when viewed from a direction perpendicular to a substrate plane of the semiconductor device, the oxide semiconductor layer is formed inside a perimeter of the gate electrode, without intersecting the perimeter of the gate electrode.

In one embodiment, step (D) comprises: a step of forming an aluminum layer included in the source electrode and the drain electrode; and a step of patterning the aluminum layer via wet etching.

In one embodiment, a liquid mixture of acetic acid, phosphoric acid, and nitric acid is used as an etchant in the step of patterning the aluminum layer via wet etching.

A production method for a TFT substrate according to the present invention is a production method for a TFT substrate of a display device having a thin film transistor and a storage capacitor disposed corresponding to a pixel, comprising: (A) a step of forming a storage capacitor electrode of the storage capacitor on a substrate; (B) a step of forming an insulating layer on the storage capacitor electrode; (C) a step of forming an oxide semiconductor layer on the insulating layer; and (D) a step of forming a storage capacitor counter electrode of the storage capacitor on the oxide semiconductor layer, wherein, when viewed from a direction perpendicular to a substrate plane of the TFT substrate, the storage capacitor counter electrode is formed so as to cover at least one of a plurality of sites at which a perimeter of the storage capacitor electrode and the oxide semiconductor layer intersect.

Another production method for a TFT substrate according to the present invention is a production method for a TFT substrate of a display device having a thin film transistor and a storage capacitor disposed corresponding to a pixel, comprising: (A) a step of forming a storage capacitor electrode of the storage capacitor on a substrate; (B) a step of forming an insulating layer formed on the storage capacitor electrode; (C) a step of forming an oxide semiconductor layer on the insulating layer; and (D) a step of forming a storage capacitor counter electrode of the storage capacitor on the oxide semiconductor layer, wherein, when viewed from a direction perpendicular to a substrate plane of the TFT substrate, the oxide semiconductor layer is formed inside a perimeter of the storage capacitor electrode, without intersecting the perimeter of the storage capacitor electrode.

In one embodiment, at step (A), a gate electrode of the thin film transistor is formed; at step (C), an oxide semiconductor layer of the thin film transistor is formed on the gate electrode; at step (D), a source electrode and a drain electrode of the thin film transistor are formed on the oxide semiconductor layer of the thin film transistor; and when viewed from a direction perpendicular to a substrate plane of the TFT substrate, the source electrode or the drain electrode covers at least one of a plurality of sites at which a perimeter of the gate electrode and a perimeter of the oxide semiconductor layer of the thin film transistor intersect.

In one embodiment, at step (A), a gate electrode of the thin film transistor is formed; at step (C), an oxide semiconductor layer of the thin film transistor is formed on the gate electrode; at step (D), a source electrode and a drain electrode of the thin film transistor are formed on the oxide semiconductor layer of the thin film transistor; and when viewed from a direction perpendicular to a substrate plane of the TFT substrate, the oxide semiconductor layer of the thin film transistor is formed inside a perimeter of the gate electrode, without intersecting the perimeter of the gate electrode.

In one embodiment, step (D) comprises: a step of forming an aluminum layer included in the source electrode and the drain electrode; and a step of patterning the aluminum layer via wet etching.

Another production method for a TFT substrate according to the present invention is a production method for a TFT substrate of a display device having a displaying region which includes a pixel having a thin film transistor, and a peripheral region formed outside the displaying region, the peripheral region including an electrical element, comprising: (A) a step of forming a gate electrode of the electrical element; (B) a step of forming an insulating layer on the gate electrode; (C) a step of forming an oxide semiconductor layer of the electrical element on the insulating layer; and (D) a step of forming a source electrode and a drain electrode on the oxide semiconductor layer, wherein, when viewed from a direction perpendicular to a substrate plane of the TFT substrate, the source electrode or the drain electrode covers at least one of a plurality of sites at which a perimeter of the gate electrode and a perimeter of the oxide semiconductor layer intersect.

Another production method for a TFT substrate according to the present invention is a production method for a TFT substrate of a display device having a displaying region which includes a pixel having a thin film transistor, and a peripheral region formed outside the displaying region, the peripheral region including an electrical element, comprising: (A) a step of forming a gate electrode of the electrical element; (B) a step of forming an insulating layer on the gate electrode; (C) a step of forming an oxide semiconductor layer of the electrical element on the insulating layer; and (D) a step of forming a source electrode and a drain electrode on the oxide semiconductor layer, wherein, when viewed from a direction perpendicular to a substrate plane of the TFT substrate, the oxide semiconductor layer is formed inside a perimeter of the gate electrode, without intersecting the perimeter of the gate electrode.

In one embodiment, at step (A), a gate electrode of the thin film transistor is formed; at step (B), a gate insulating layer is formed on the gate electrode of the thin film transistor; at step (C), an oxide semiconductor layer of the thin film transistor is formed on the gate insulating layer; at step (D), a source electrode and a drain electrode of the thin film transistor are formed on the oxide semiconductor layer of the thin film transistor; and when viewed from a direction perpendicular to a substrate plane of the TFT substrate, the source electrode or the drain electrode of the thin film transistor covers at least one of a plurality of sites at which the perimeter of the gate electrode of the thin film transistor and the perimeter of the oxide semiconductor layer of the thin film transistor intersect.

In one embodiment, at step (A), a gate electrode of the thin film transistor is formed; at step (B), a gate insulating layer is formed on the gate electrode; at step (C), an oxide semiconductor layer of the thin film transistor is formed on the gate insulating layer; at step (D), a source electrode and a drain electrode of the thin film transistor are formed on the oxide semiconductor layer of the thin film transistor; and when viewed from a direction perpendicular to a substrate plane of the TFT substrate, the oxide semiconductor layer of the thin film transistor is formed inside a perimeter of the gate electrode of the thin film transistor, without intersecting the perimeter of the gate electrode of the thin film transistor.

In one embodiment, step (D) comprises: a step of forming an aluminum layer included in the source electrode and the drain electrode of the electrical element; and a step of patterning the aluminum layer via wet etching.

Advantageous Effects of Invention

According to the present invention, it is possible to produce a semiconductor device having excellent TFT characteristics with a good production efficiency, by reducing damage to an oxide semiconductor layer that occurs during the production of an oxide semiconductor TFT or an electrical element having an oxide semiconductor. Also according to the present invention, it is possible to produce a display device having such a TFT or the like, with a high performance and good production efficiency.

Moreover, according to the present invention, etchant residues are unlikely to remain at any stepped portion of layers above the edge of a gate electrode of an electrical element such as a TFT, or a storage capacitor electrode, and the etchant is prevented from seeping from the stepped portion to erode the oxide semiconductor layer. Therefore, a high-quality TFT substrate and display device with little variation in performance can be provided.

Moreover, according to the present invention, it is possible to form an oxide semiconductor TFT through production steps which are basically similar to those of an amorphous silicon TFT. Therefore, an oxide semiconductor TFT, as well as a semiconductor device, display device, etc. having an oxide semiconductor TFT, can be produced at low cost.

Description of Embodiments

Hereinafter, with reference to the drawings, semiconductor devices and display devices according to embodiments of the present invention, and production methods for the semiconductor devices and display devices, will be described. However, the scope of the invention is not to be limited to the following embodiments. The semiconductor device of the present embodiment is a TFT substrate on which an oxide semiconductor TFT is formed, and broadly encompasses TFT substrates of various display devices, electronic devices, and the like. However, in the description of the present embodiment, the semiconductor device will be illustrated as a TFT substrate of a display device having oxide semiconductor TFTs as switching elements.

(Embodiment 1)

Figure 1:
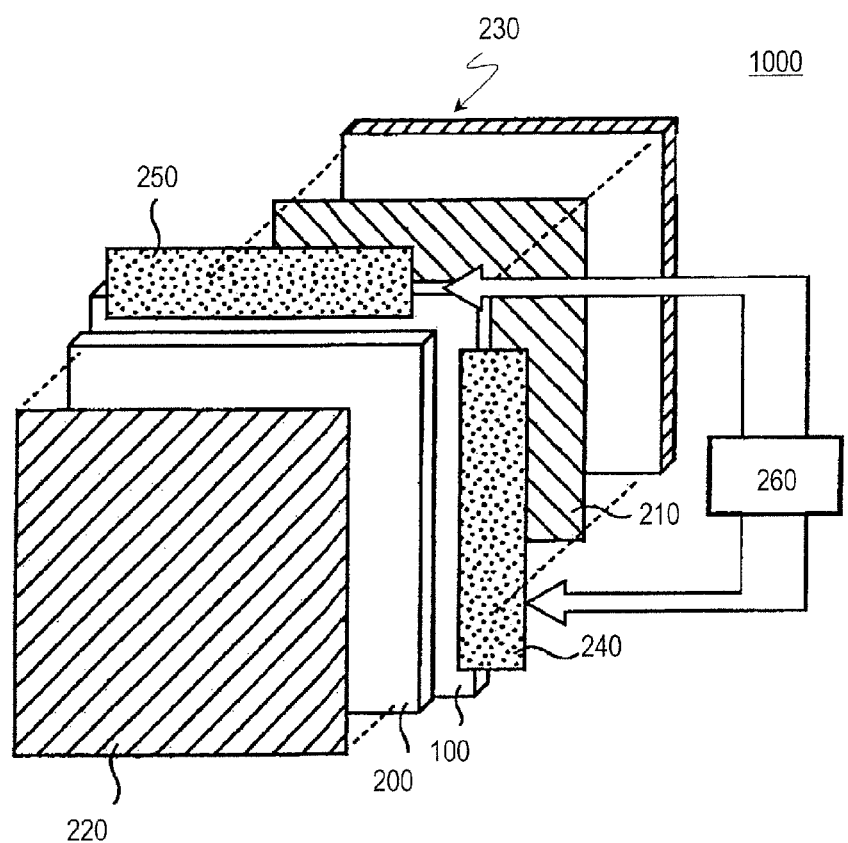
[FIG. 1] A perspective view schematically showing the construction of a liquid crystal display device 1000 according to the present invention.

FIG. 1 is a perspective view schematically showing the construction of a liquid crystal display device 1000 according to an embodiment of the present invention.

As shown in FIG. 1, the liquid crystal display device 1000 includes: a TFT substrate (semiconductor device) 100 and a counter substrate 200, which oppose each other with a liquid crystal layer interposed therebetween; polarizers 210 and 220 provided respectively outside the TFT substrate 100 and the counter substrate 200; and a backlight unit 230 which emits light for displaying toward the TFT substrate 100. On the TFT substrate 100, a scanning line driving circuit 240 for driving a plurality of scanning lines (gate bus lines) and a signal line driving circuit 250 for driving a plurality of signal lines (data bus lines) are disposed. The scanning line driving circuit 240 and the signal line driving circuit 250 are connected to a control circuit 260 which is internal or external to the TFT substrate 100. Under control of the control circuit 260, scanning signals for switching the TFTs ON/OFF are supplied from the scanning line driving circuit 240 to the plurality of scanning lines, and display signals (applied voltages to the pixel electrodes) are supplied from the signal line driving circuit 250 to the plurality of signal lines.

The counter substrate 200 includes color filters and a common electrode. In the case of displaying in three primary colors, the color filters include an R (red) filter, a G (green) filter, and a B (blue) filter each provided corresponding to a pixel. The common electrode is formed so as to oppose the plurality of pixel electrodes, with the liquid crystal layer interposed therebetween. In accordance with a potential difference applied between the common electrode and each pixel electrode, the liquid crystal molecules between the electrodes become aligned for the respective pixel, whereby displaying is performed.

Figure 2:
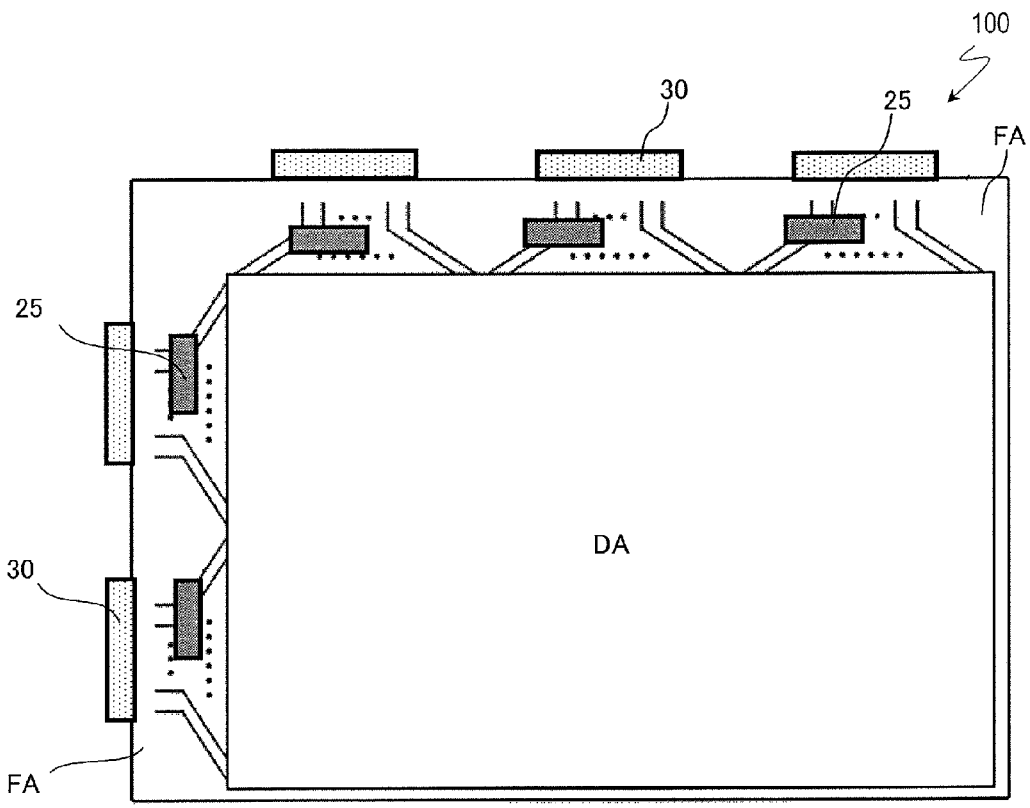
[FIG. 2] A plan view schematically showing the construction of a TFT substrate (semiconductor device) 100 of the liquid crystal display device 1000.
Figure 3:
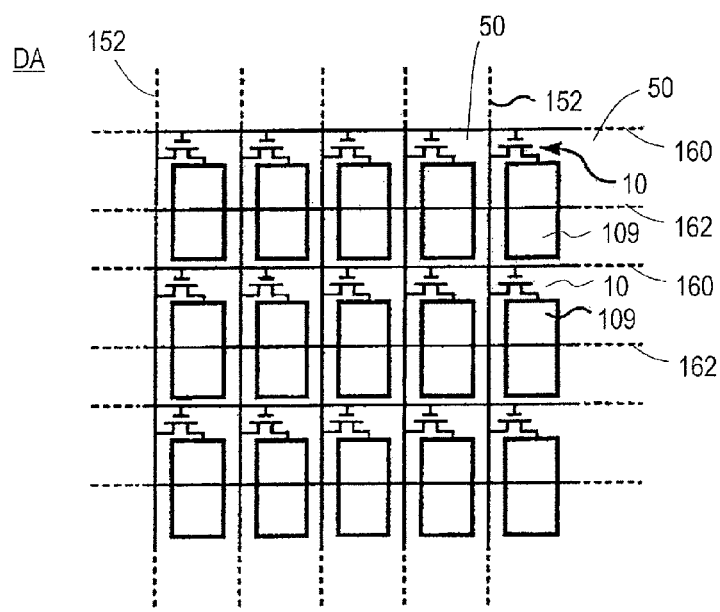
[FIG. 3] A plan view schematically showing the construction of a displaying region DA of the TFT substrate 100.

FIG. 2 is a plan view schematically showing the construction of the TFT substrate 100; FIG. 3 is a plan view schematically showing the construction of a displaying region DA of the TFT substrate 100; and FIG. 4 is a plan view schematically showing the construction of a pixel 50 of the TFT substrate 100.

As shown in FIG. 2, the TFT substrate 100 has a display section DA and a peripheral portion FA located outside the display section DA. In the peripheral portion FA, electrical elements 25 such as the scanning line driving circuit 240, the signal line driving circuit 250, and voltage supply circuits are disposed in COG (Chip on Glass) fashion. Also in the peripheral portion FA, electrical elements such as TFTs or diodes have been formed through the same production steps as the TFTs in the display section DA. Moreover, terminal portions 30 are provided near outer ends of the peripheral portion FA for attaching external devices, e.g., FPCs (Flexible Printed Circuits).

Figure 4:
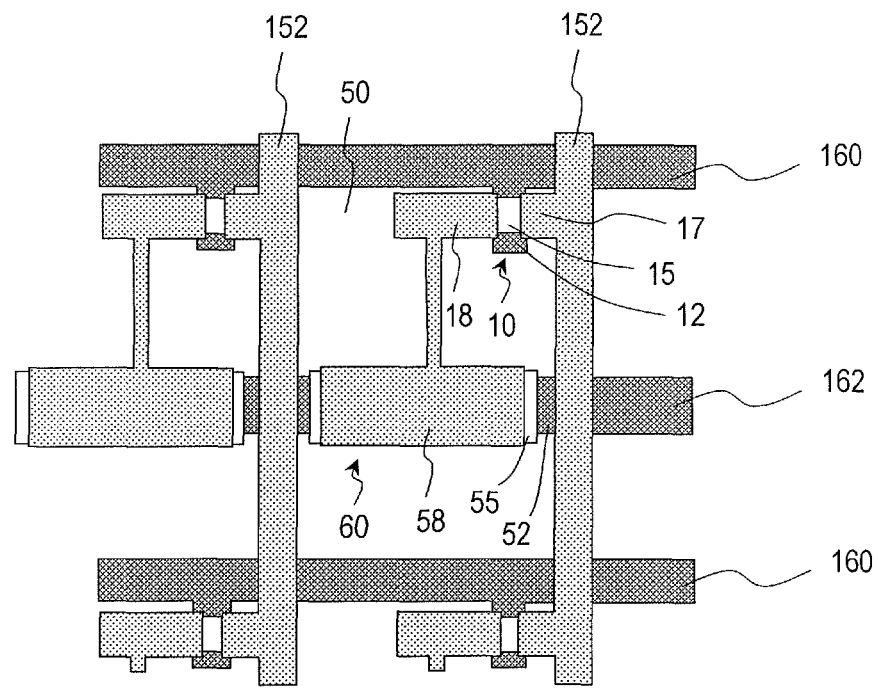
[FIG. 4] A plan view schematically showing the construction of a pixel 50 of the TFT substrate 100 according to Embodiment 1 of the present invention.

As shown in FIGS. 3 and 4, a plurality of pixels 50 are arranged in a matrix array in the display section DA, and a plurality of scanning lines 160 and a plurality of signal lines 152 are disposed orthogonal to one another. The scanning lines 160 partly constitute gate electrodes of the TFTs 10. Near each of the intersections between the plurality of scanning lines 160 and the plurality of signal lines 152, a thin film transistor (TFT) 10 is formed as an active element for each pixel 50. In each pixel 50, a pixel electrode 109 which is made of e.g. ITO (Indium Tin Oxide) is disposed, the pixel electrode 109 being electrically connected to the drain electrode 18 of the TFT 10. Moreover, between any two adjacent scanning lines 160, a storage capacitor line (also referred to as a Cs line) 162 extends in parallel to the scanning lines 160.

In each pixel 10, a storage capacitor (Cs) 60 is formed, such that a portion of the storage capacitor line 162 serves as a storage capacitor electrode (lower electrode) 52 of the storage capacitor 60. The storage capacitor 60 is composed of: the storage capacitor electrode 52, a storage capacitor counter electrode (upper electrode) 58, and an oxide semiconductor layer 55 interposed between the electrodes. The storage capacitor counter electrode 58 is electrically connected to the drain electrode 18 of the TFT 10.

The gate electrode, the scanning line 160, the storage capacitor line 162, and the storage capacitor electrode 52 are formed of the same material and through the same steps. The source electrode 17, the drain electrode 18, the signal line 152, and the storage capacitor counter electrode 58 are formed of the same material and through the same steps. The oxide semiconductor layer 15 of the TFT 10 and the oxide semiconductor layer 55 of the storage capacitor are formed of the same material and through the same steps.

Although not shown, a plurality of connection lines are formed at the boundary between the displaying region DA and the peripheral region FA. Each signal line 152 is electrically connected to a connection line via a correspondingly-formed connecting portion. The connecting portion allows the signal line 152 as an overlying connection line to be connected to the connection line as an underlying connection line. Moreover, the drain electrode 18 of each TFT 10 is connected to the storage capacitor counter electrode 58, which is an upper electrode of the storage capacitor, the storage capacitor counter electrode 58 being connected to the pixel electrode 109 via a contact hole which is formed in the interlayer insulating layer.

On the peripheral region FA side, other connecting portions are disposed. At the connecting portions in the peripheral region FA, the connection lines are connected to overlying connection lines in the peripheral region FA, the overlying connection lines being connected to the electrical elements 25. Moreover, the scanning lines 160, as underlying connection lines, are connected to overlying connection lines in the peripheral region FA via the connecting portions, and thereafter connected to the electrical elements 25. Each electrical element 25 and each terminal portion 30 are connected via a plurality of connection lines.

Figure 5:
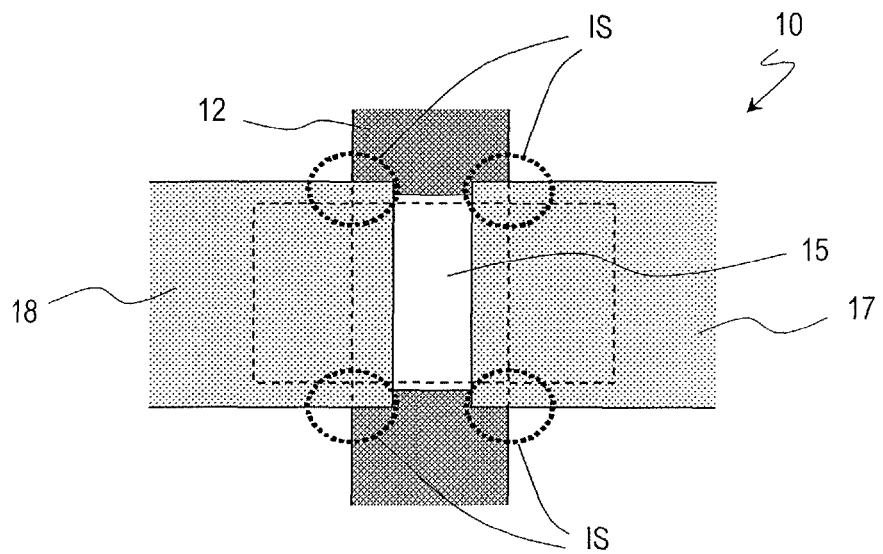
[FIG. 5] A plan view schematically showing the construction of a TFT 10 on the TFT substrate 100 according to Embodiment 1.

FIG. 5 is a plan view schematically showing relative positioning of the gate electrode 12, the oxide semiconductor layer 15, the source electrode 17, and the drain electrode 18 in a TFT 10.

As will be later shown by FIG. 6(g), the TFT 10 includes: a gate electrode 12 formed on a substrate 11, e.g., a glass substrate; a gate insulating layer 13 (which may simply be referred to as the "insulating layer 13") formed on the gate electrode 12; the oxide semiconductor layer 15 formed on the gate insulating layer 13; the source electrode and the drain electrode 18 disposed on the oxide semiconductor layer 15 so as to oppose each other with a channel portion being interposed therebetween; and a protection layer (passivation layer) 19 formed on the source electrode 17 and the drain electrode 18.

The source electrode 17 has a two-layer structure in which an upper source electrode layer 17B of aluminum (Al) is formed on a lower source electrode layer 17A of titanium (Ti), for example (see FIG. 6(f)). Similarly, the drain electrode 18 has a two-layer structure in which an upper drain electrode layer 18B of aluminum is formed on a lower drain electrode layer 18A of titanium. The gate electrode 12 is composed of three layers of titanium/aluminum/titanium. The gate electrode 12 may be of a two-layer construction having a titanium layer and an aluminum layer formed thereon.

As shown in FIG. 5, the oxide semiconductor layer 15 is disposed so as to partially cover the gate electrode 12, so that the longitudinal direction thereof lies orthogonal to a direction in which the gate electrode 12 extends. When viewed from a direction perpendicular to the substrate plane of the TFT substrate 100, the source electrode 17 and the drain electrode 18 cover four sites (near the centers of IS's in the figure) where the perimeter of the gate electrode 12 and the perimeter of the oxide semiconductor layer 15 intersect.

An alternative construction for the TFT 10 would be where the source electrode 17 or the drain electrode 18 covers at least one of the four sites at which the perimeter of the gate electrode 12 and the perimeter of the oxide semiconductor layer 15 intersect.

Figure 6:
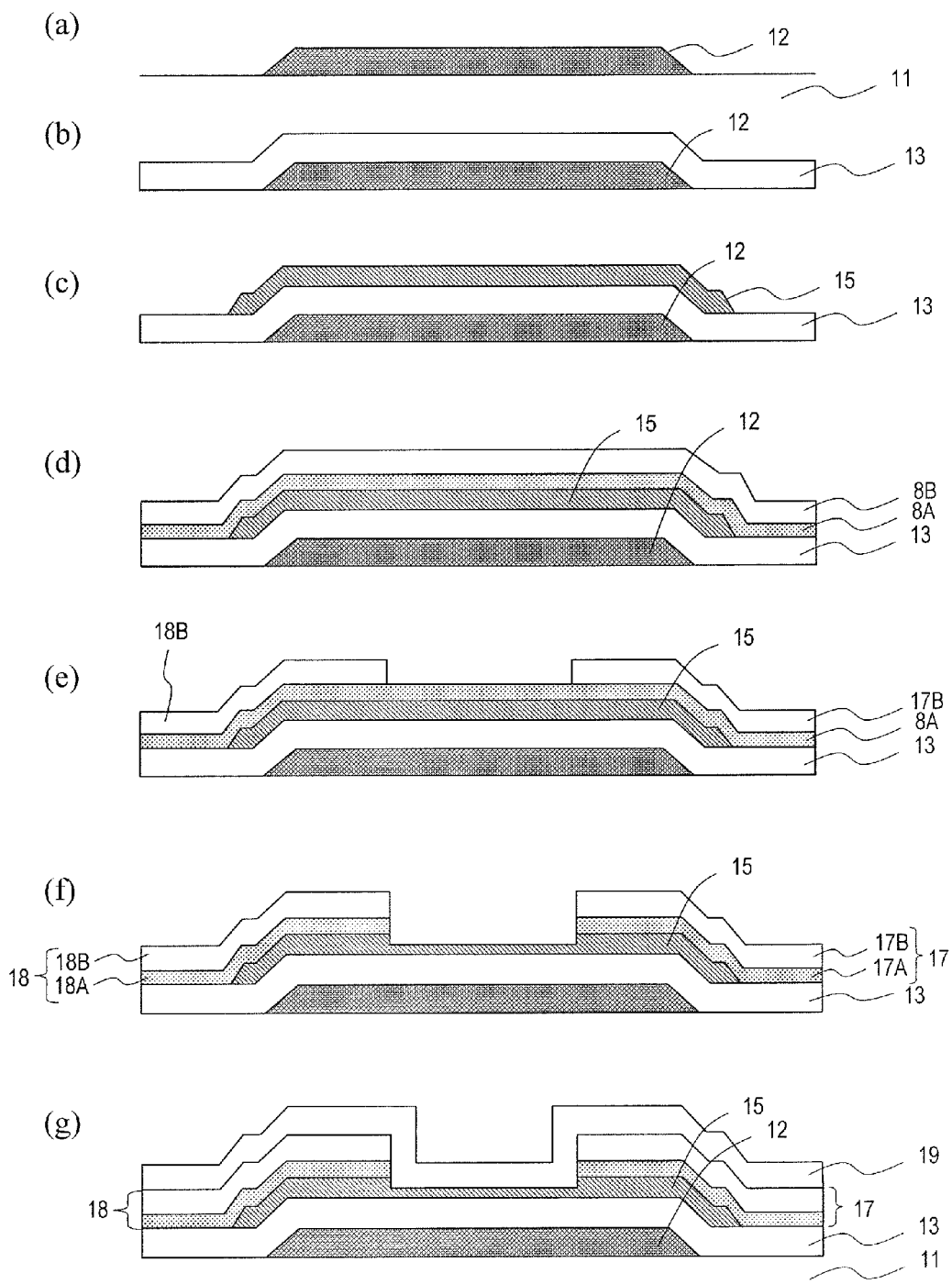
[FIG. 6] (a) to (g) are cross-sectional views schematically showing production steps for the semiconductor device 100.

Next, a production method for the TFT substrate 100 will be described with reference to FIG. 6.

FIGS. 6(a) to (g) are schematic cross-sectional views showing production steps for the TFT substrate 100. Herein, the production steps are illustrated by using a cross section of a TFT 10 portion of the TFT 100.

Step (a):
First, for example, a Ti layer, an Al layer, and a Ti layer are stacked in this order on the substrate 11 by a sputtering technique or the like. Next, the three stacked layers are patterned by using known photolithography and wet etching techniques (first mask step) to obtain a gate electrode 12 shown in FIG. 6(a). At this time, scanning lines 160 and storage capacitor lines 162 not shown are also formed at the same time. Thereafter, the remaining resist is removed and the substrate is cleaned.

Step (b):
Next, as shown in FIG. 6(b), a gate insulating layer 13 is formed on the substrate 11, so as to cover the gate electrode 12. The gate insulating layer 13 is a silicon oxide ($SiO_2$) layer which is stacked to a thickness of about 250 nm by a CVD technique using a gaseous mixture of silane ($SiH_4$) and nitrous oxide ($N_2O$), or tetraethoxysilane (TEOS). The gate insulating layer 13 may be of a two-layer construction having a silicon nitride (SiNx) layer and a silicon oxide ($SiO_2$) layer stacked thereon.

Step (c):
Next, an oxide semiconductor is stacked on the gate insulating layer 13. The oxide semiconductor is formed by stacking, for example, an In—Ga—Zn—O type semiconductor (IGZO) to a thickness 10 to 100 nm using a sputtering technique. Thereafter, the stacked oxide semiconductor is patterned by a photolithography technique, and a wet etching technique using oxalic acid or the like (second mask step), whereby an oxide semiconductor layer 15 to become a channel layer of the TFT 10 is obtained as shown in FIG. 6(c). Thereafter, the remaining resist is removed and the substrate is cleaned. Instead of IGZO, other types of oxide semiconductor films may be used as the oxide semiconductor.

Step (d):
Next, as shown in FIG. 6(d), a Ti layer 8A and an Al layer 8B are stacked in this order on the gate insulating layer 13 so as to cover the oxide semiconductor layer 15, by using a sputtering technique. The Ti layer 8A has a thickness of e.g. 30 nm, and the Al layer 8B has a thickness of e.g. 200 nm.

Step (e):
Next, the Al layer 8B is patterned by using photolithography and wet etching techniques, thereby removing a portion of the Al layer 8B on the oxide semiconductor layer 15 as shown in FIG. 6(e) (third mask step). As the etchant, a liquid mixture of acetic acid, phosphoric acid, and nitric acid is used. Since the Ti layer 8A serves as an etch stopper, the oxide semiconductor layer 15 is not removed through the etching.

Moreover, when viewed perpendicularly to the substrate plane, the edge of the Al layer 8B is located outside of the four sites at which the perimeter of the gate electrode 12 and the perimeter of the oxide semiconductor layer 15 intersect. In other words, the Al layer 8B is formed so as to cover these four sites. Therefore, even if the etchant intrudes into the Ti layer 8A at the edge of the Al layer 8B near a stepped portion of the layers formed above these four portions, the position of intrusion will be far from the oxide semiconductor layer 15, so that the oxide semiconductor layer 15 is prevented from being eroded.

Step (f):
Next, with a dry etching technique, the exposed portion of the Ti layer 8A and an upper part of the exposed portion of the oxide semiconductor layer 15 are removed, whereby the source electrode 17 and drain electrode 18 having a two-layer construction and an oxide semiconductor layer 15 having a channel layer are accomplished, as shown in FIG. 6(f). As the etching gas, a gaseous mixture of tetrafluoromethane ($CF_4$) and oxygen ($O_2$), chlorine ($Cl_2$), or the like is used.

In this step, the source electrode 17 and the drain electrode 18 are formed so as to cover all of the four sites at which the perimeter of the gate electrode 12 and the perimeter of the oxide semiconductor layer 15 intersect when viewed from a direction perpendicular to the substrate plane of the TFT substrate 100. The source electrode 17 and the drain electrode 18 may be formed so as to cover at least one of the four sites at which the perimeter of the gate electrode 12 and the perimeter of the oxide semiconductor layer 15 intersect, whereby effects of the present invention will at least be partially obtained.

Step (g):
Next, as shown in FIG. 6(g), a protection layer (passivation layer) 19 is formed on the substrate 11, whereby the TFT 10 is completed. The protection layer 19 is a silicon oxide layer, which is stacked to a thickness of about 250 nm by a CVD technique using a gaseous mixture of silane and nitrous oxide, or tetraethoxysilane.

Thereafter, although omitted from illustration in the figure, an interlayer insulating layer is formed on the protection layer 19, and a pixel electrode 109 is formed on the interlayer insulating layer from a transparent electrode member, e.g., ITO. The pixel electrode 109 and the drain electrode 18 are electrically connected via contact holes formed in the interlayer insulating layer and the protection layer 19.

According to the present embodiment, since stepped portions of layers above the edge of the gate electrode 12 of the TFT is covered by the source electrode 17 and the drain electrode 18, residues of the etchant that is used for etching the source electrode 17 and the drain electrode 18 are unlikely to remain at the stepped portions, and the etchant is prevented from seeping from the stepped portion to erode the oxide semiconductor layer 15. Thus, a high-quality oxide semiconductor TFT with little variation in performance can be provided.

Moreover, the position of any stepped portion of layers above the edge of the gate electrode 12 of the TFT, and the edge position of the oxide semiconductor layer 15, are far from the edge of the source electrode 17 and the drain electrode 18; thus, the etchant is unlikely to intrude into the oxide semiconductor layer 15, whereby the oxide semiconductor layer 15 is prevented from erosion. Thus, a high-quality oxide semiconductor TFT with little variation in performance can be provided.

Moreover, since an oxide semiconductor TFT can be formed through production steps which are basically similar to those of an amorphous silicon TFT, the oxide semiconductor TFT can be produced at low cost.

Next, other embodiments of the present invention (Embodiments 2 to 7) will be described.

(Embodiment 2)

Figure 7:
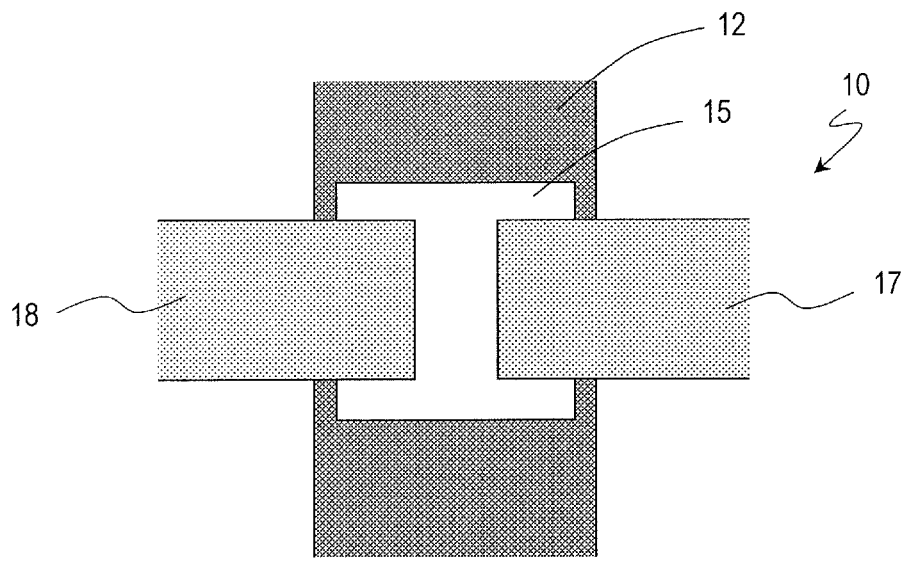
[FIG. 7] A plan view schematically showing the construction of a TFT 10 according to Embodiment 2 of the present invention.

FIG. 7 is a cross-sectional view schematically showing the construction of a TFT 10 on a TFT substrate according to Embodiment 2. Other than what is described below, the TFT substrate is basically identical in construction to the TFT substrate 100 of Embodiment 1. Constituent elements of like functions are denoted by like reference numerals, and detailed descriptions thereof are omitted.

The TFT 10 of Embodiment 2 includes a gate electrode 12, a gate insulating layer 13 (omitted from illustration in FIG. 7) formed on the gate electrode 12, an oxide semiconductor layer 15 disposed on the gate insulating layer 13, and a source electrode 17 and a drain electrode 18 formed on the oxide semiconductor layer 15. When viewed from a direction perpendicular to the substrate plane of the TFT substrate 100, the oxide semiconductor layer 15 is formed inside the perimeter of the gate electrode 12, without intersecting the perimeter of the gate electrode 12. In other words, without protruding from the gate electrode 12, the entirety of the oxide semiconductor layer 15 is formed upon the gate electrode 12.

In producing the TFT substrate of Embodiment 2, at step (c) described in Embodiment 1, the oxide semiconductor layer 15 is formed inside the perimeter of the gate electrode 12 as viewed from a direction perpendicular to the substrate plane of the TFT substrate, without intersecting the perimeter of the gate electrode 12.

In accordance with the TFT substrate of the present embodiment, the oxide semiconductor layer 15 is formed so as not to be protruding from the gate electrode 12 when viewed perpendicularly to the substrate plane. Therefore, no oxide semiconductor layer 15 is formed on the stepped portions of the gate insulating layer 13 above the perimeter of the gate electrode 12. Thus, when forming the source electrode 17 and the drain electrode 18, the etchant for wet etching never seeps to erode the oxide semiconductor layer 15.

According to the present embodiment, the oxide semiconductor layer 15 is formed on a flat portion of the gate insulating layer 13, and is not formed on any stepped portion above the perimeter of the gate insulating layer 13. Therefore, when forming the source electrode 17 and the drain electrode 18, the etchant for wet etching is prevented from seeping to erode or remove the oxide semiconductor layer 15. Thus, similarly to the TFT of Embodiment 1, a highly-reliable TFT substrate having the TFT 10 with desired characteristics can be provided.

Moreover, the position of any stepped portion of layers above the edge of the gate electrode 12 of the TFT 10, and the edge position of the oxide semiconductor layer 15, are far from the edge of the source electrode 17 and the drain electrode 18; therefore, the etchant is unlikely to intrude into the oxide semiconductor layer 15, whereby the oxide semiconductor layer 15 is prevented from erosion. Thus, a high-quality oxide semiconductor TFT with little variation in performance can be provided.

Moreover, since an oxide semiconductor TFT can be formed through production steps which are basically similar to those of an amorphous silicon TFT, the oxide semiconductor TFT can be produced at low cost.

(Embodiment 3)

Figure 8:
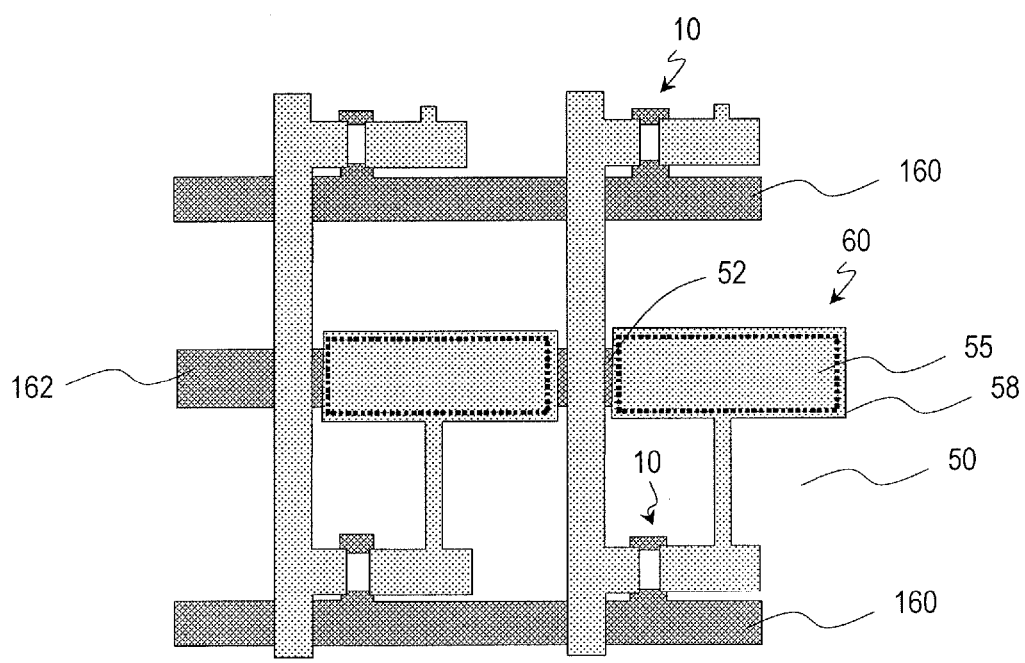
[FIG. 8] A plan view schematically showing the construction of a pixel 50 on the TFT substrate 100 according to Embodiment 3 of the present invention.

FIG. 8 is a cross-sectional view schematically showing the construction of a pixel 50 of a TFT substrate according to Embodiment 3. Other than what is described below, the TFT substrate is basically identical in construction to the TFT substrate 100 of Embodiment 1. Constituent elements of like functions are denoted by like reference numerals, and detailed descriptions thereof are omitted.

The TFT substrate of Embodiment 3 includes a TFT 10 of the construction described in Embodiment 1. The TFT 10 construction in Embodiment 2 may be adopted on the TFT substrate of Embodiment 3.

A storage capacitor 60 on the TFT substrate of Embodiment 3 includes a storage capacitor electrode 52, an oxide semiconductor layer 55 formed on the storage capacitor electrode 52, and a storage capacitor counter electrode 58 formed on the oxide semiconductor layer 55. When viewed from a direction perpendicular to the substrate plane of the TFT substrate, the storage capacitor counter electrode 58 covers all of a plurality of sites at which the perimeter of the storage capacitor electrode 52 and the perimeter of the oxide semiconductor layer 55 intersect. It may be some of the plurality of sites at which the perimeter of the storage capacitor electrode 52 and the perimeter of the oxide semiconductor layer 55 intersect that the storage capacitor counter electrode 58 covers.

In producing the TFT substrate of Embodiment 3, at step (a) described in Embodiment 1, on the substrate 11, the storage capacitor electrode 52 is formed from the same material as the gate electrode 12 of the TFT 10 and at the same time as the gate electrode 12. Next, at step (b), an insulating layer of the storage capacitor 60 is formed from the same material as the gate insulating layer 13 and at the same time as the gate insulating layer 13. Thereafter, at step (c), the oxide semiconductor layer 55 of the storage capacitor 60 is formed at the same time and from the same material as the oxide semiconductor layer 15 of the TFT 10. At this time, the oxide semiconductor layer 55 is formed so as to protrude from the storage capacitor electrode 52 when viewed from a direction perpendicular to a substrate plane.

Next, at steps (d) to (f), the storage capacitor counter electrode 58 is formed on the oxide semiconductor layer 55, at the same time, with the same method, and from the same material as the source electrode 17 and the drain electrode 18 of the TFT 10. At this time, the storage capacitor counter electrode 58 is formed so as to cover the plurality of sites at which the perimeter of the storage capacitor electrode 52 and the perimeter of the oxide semiconductor layer 55 intersect.

According to the present embodiment, since stepped portions of layers above the edge of the storage capacitor electrode 52 are covered by the storage capacitor counter electrode 58, residues of the etchant used for etching the storage capacitor counter electrode 58 are unlikely to remain on the stepped portions, and the etchant is prevented from seeping from the stepped portion to erode the oxide semiconductor layer 55. Thus, a high-quality storage capacitor with little variation in performance can be provided.

Moreover, the position of any stepped portion of layers above the edge of the storage capacitor electrode 52, and the edge position of the oxide semiconductor layer 55, are far from the edge of the storage capacitor counter electrode 58; thus, the etchant is unlikely to intrude into the oxide semiconductor layer 55, whereby the oxide semiconductor layer 55 is prevented from erosion. Thus, a high-quality oxide semiconductor TFT with little variation in performance can be provided.

(Embodiment 4)

Figures 9, 10:
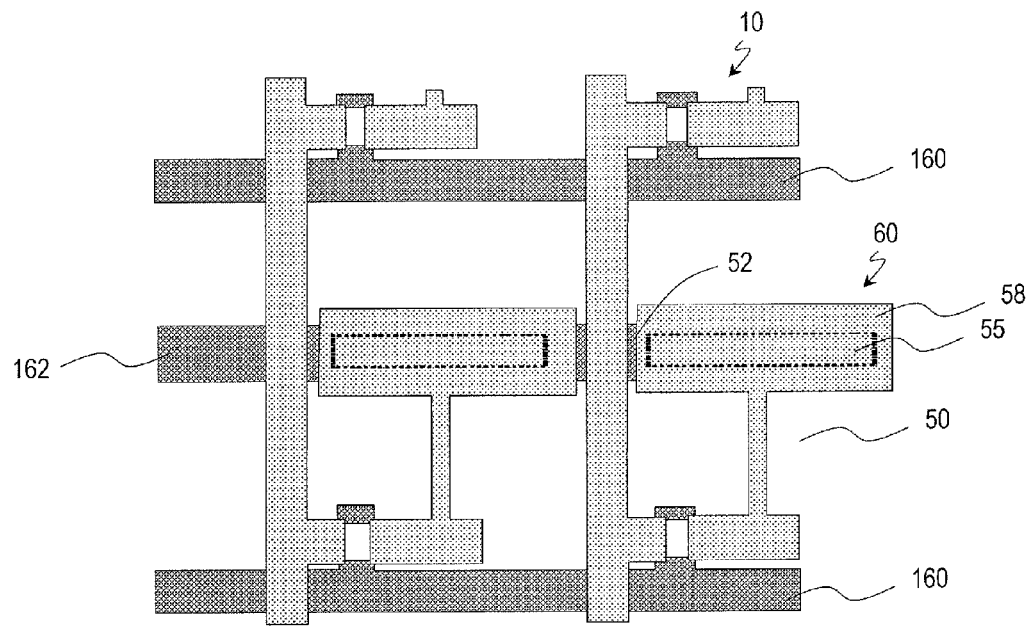
[FIG. 9] A plan view schematically showing the construction of a pixel 50 on the TFT substrate 100 according to Embodiment 4 of the present invention.
[FIG. 10] (a) is a circuit diagram showing the construction of a peripheral circuit 90 on the TFT substrate 100 according to Embodiment 5 of the present invention, and (b) is a plan view schematically showing the construction of the peripheral circuit 90.

FIG. 9 is a cross-sectional view schematically showing the construction of a pixel 50 of a TFT substrate according to Embodiment 4. Other than what is described below, the TFT substrate is basically identical in construction to the TFT substrate 100 of Embodiment 1. Constituent elements of like functions are denoted by like reference numerals, and detailed descriptions thereof are omitted.

The TFT substrate of Embodiment 4 includes a TFT 10 of the construction described in Embodiment 1. The TFT 10 construction in Embodiment 2 may be adopted on the TFT substrate of Embodiment 4.

A storage capacitor 60 on the TFT substrate of Embodiment 4 includes a storage capacitor electrode 52, an oxide semiconductor layer 55 formed on the storage capacitor electrode 52, and a storage capacitor counter electrode 58 formed on the oxide semiconductor layer 55. When viewed from a direction perpendicular to the substrate plane of the TFT substrate, the oxide semiconductor layer 55 is formed inside the perimeter of the storage capacitor electrode 52, without intersecting the perimeter of the storage capacitor electrode 52. In other words, without protruding from the storage capacitor electrode 52, the entirety of the oxide semiconductor layer 55 is formed upon the storage capacitor electrode 52. The storage capacitor counter electrode 58 is formed so as to cover the entire oxide semiconductor layer 55.

In producing the TFT substrate of Embodiment 4, at step (a) described in Embodiment 1, on the substrate 11, the storage capacitor electrode 52 is formed from the same material as the gate electrode 12 of the TFT 10 and at the same time as the gate electrode 12. Next, at step (b), an insulating layer of the storage capacitor 60 is formed from the same material as the gate insulating layer 13 and at the same time as the gate insulating layer 13. Thereafter, at step (c), the oxide semiconductor layer 55 of the storage capacitor 60 is formed at the same time and from the same material as the oxide semiconductor layer 15 of the TFT 10. At this time, the oxide semiconductor layer 55 is formed inside the storage capacitor electrode 52 as viewed from a direction perpendicular to a substrate plane.

Next, at steps (d) to (f), the storage capacitor counter electrode 58 is formed so as to cover the oxide semiconductor layer 55, at the same time, with the same method, and from the same material as the source electrode 17 and the drain electrode 18 of the TFT 10.

In the TFT substrate of the present embodiment, the oxide semiconductor layer 55 is formed on a flat portion of the insulating layer above the storage capacitor electrode 52, and is not formed on any stepped portion of the insulating layer above the perimeter of the storage capacitor electrode 52. Therefore, when forming the storage capacitor counter electrode 58, the etchant for wet etching is prevented from seeping to erode or remove the oxide semiconductor layer 55. Thus, a highly-reliable TFT substrate having a storage capacitor 60 which reliably ensures a desired capacitance can be provided.

Moreover, the position of any stepped portion of layers above the edge of the storage capacitor electrode 52, and the edge position of the oxide semiconductor layer 55, are far from the edge of the storage capacitor counter electrode 58; thus, the etchant is unlikely to intrude into the oxide semiconductor layer 55, whereby the oxide semiconductor layer 55 is prevented from erosion. Thus, a high-quality oxide semiconductor TFT with little variation in performance can be provided.

(Embodiment 5)

FIG. 10 is a diagram showing a peripheral circuit 90 on a TFT substrate according to Embodiment 5, where (a) is a circuit diagram of the peripheral circuit 90, and (b) is a plan view schematically showing the construction of the peripheral circuit.

The peripheral circuit 90 is an element formed in a peripheral region FA as shown in FIG. 2, the peripheral circuit 90 having TFTs, diodes, or the like. In the present embodiment, the peripheral circuit 90 will be illustrated as a protection circuit including diodes. Other than what is described below, the TFT substrate is basically identical in construction to the TFT substrate 100 of Embodiment 1; therefore, mainly the differences therefrom will be described.

In addition to the TFT substrate 100 described with reference to FIG. 2 and FIG. 3, the TFT substrate of Embodiment 5 also includes the peripheral circuit 90 (hereinafter also referred to as the protection circuit 90). The protection circuit 90 includes two diodes 70A and 70B that are formed near a region at which a signal line 152 and a scanning line 160 (or extensions of these connection lines) intersect. It is meant that the peripheral circuit 90 encompasses any electrical element in which transistors are provided instead of diodes 70A and 70B.

The diodes 70A and 70B each include a gate electrode 12, a gate insulating layer 13 (omitted from illustration in FIG. 10) formed on the gate electrode 12, an oxide semiconductor layer 15 disposed on the gate insulating layer 13, and a source electrode 17 and a drain electrode 18 formed on the oxide semiconductor layer 15.

The gate electrode (gate terminal) 12 and the drain electrode (drain terminal) 18 of the diode 70A are connected to the scanning line 160, while its source electrode (source terminal) 17 is connected to the signal line 152. The gate electrode (gate terminal) 12 and the drain electrode (drain terminal) 18 of the diode 70B are connected to the signal line 152, while its source electrode (source terminal) 17 is connected to the scanning line 160. Thus, between the scanning line 160 and the signal line 152, the diodes 70A and 70B are formed in such a manner that their directions of rectification are reversed. Note that the drain electrode 18 of the diode 70A and the source electrode 17 of the diode 70B are connected to the scanning line 160 via contact holes CH which are formed in the insulating layer, while the gate electrode 12 of the diode 70B is connected to the signal line 152 via other contact holes CH which are formed in the insulating layer.

In the protection circuit 90, if the scanning line 160 is positively or negatively charged relative to the potential of the signal line 152 owing to static electricity or the like, a current will flow in a direction of canceling that charge. For example, if the scanning line 160 becomes positively charged, a current will flow in a manner of allowing that positive charge to exit to the signal line 152. This prevents the electrostatic discharge damage or a shift in threshold voltage of a TFT 10 connected to the charged scanning line 160. Also, a breakdown between the scanning line 160 and another connection line that intersects it via the insulating layer can also be prevented.

Similarly to the TFT 10 of Embodiment 1, when viewed from a direction perpendicular to the substrate plane of the TFT substrate 100, the source electrode 17 and the drain electrode 18 of each of the diodes 70A and 70B covers a plurality of sites at which the perimeter of the gate electrode 12 and the perimeter of the oxide semiconductor layer 15 intersect.

In producing the TFT substrate of Embodiment 5, at step (a) described in Embodiment 1, the gate electrodes 12 of the diodes 70A and 70B are formed on the substrate 11, from the same material as the gate electrode 12 of the TFT 10. Next, at step (b), the insulating layers of the diodes 70A and 70B are formed from the same material as the gate insulating layer 13. Thereafter, at step (c), the oxide semiconductor layers 15 of the diodes 70A and 70B are formed at the same time and from the same material as the oxide semiconductor layer 15 of the TFT 10.

Next, at steps (d) to (f), the source electrode 17 and the drain electrode 18 are formed on the oxide semiconductor layer 15, at the same time, with the same method, and from the same material as the source electrode 17 and the drain electrode 18 of the TFT 10. At this time, the source electrode 17 and the drain electrode 18 are formed so as to cover the plurality of sites at which the perimeter of the gate electrode 12 and the perimeter of the oxide semiconductor layer 15 intersect.

According to the present embodiment, since the stepped portions of layers above the edge of the gate electrode 12 of the peripheral circuit 90 are covered by the source electrode 17 and the drain electrode 18, residues of the etchant that is used for etching the source electrode 17 and the drain electrode 18 are unlikely to remain at the stepped portion, and the etchant is prevented from seeping from the stepped portion to erode the oxide semiconductor layer 15. Thus, a high-quality peripheral circuit 90 with little variation in performance can be provided.

Moreover, the position of any stepped portion of layers above the edge of the gate electrode 12 of the peripheral circuit 90, and the edge position of the oxide semiconductor layer 15, are far from the edge of the source electrode 17 and the drain electrode 18; therefore, the etchant is unlikely to intrude into the oxide semiconductor layer 15, whereby the oxide semiconductor layer 15 is prevented from erosion. Thus, a high-quality peripheral circuit 90 with little variation in performance can be provided.

Moreover, since electrical elements on the peripheral circuit 90 can be formed through production steps which are basically similar to those of an amorphous silicon TFT, the TFT substrate can be provided at low cost.

(Embodiment 6)

Similarly to Embodiment 5, the TFT substrate of Embodiment 6 includes a peripheral circuit 90 formed in the peripheral region. The TFT substrate of the present embodiment differs from the TFT substrate of Embodiment 5 only with respect to the construction of the diodes 70A and 70B, and is otherwise identical in construction to Embodiment 5. Hereinafter, for simplicity, reference to figures will be omitted, and the differences from Embodiment 5 will mainly be described.

Similarly to the TFT 10 of Embodiment 2 shown in FIG. 7, when viewed from a direction perpendicular to the substrate plane of the TFT substrate, the oxide semiconductor layer 15 of each of the diodes 70A and 70B is formed on the gate electrode 12, so as to be inside the perimeter of the gate electrode 12 and not intersecting the perimeter of the gate electrode 12.

In producing the TFT substrate of Embodiment 6, at step (c) described in Embodiment 1, the oxide semiconductor layers 15 of the diodes 70A and 70B are formed at the same time and from the same material as the oxide semiconductor layer 15 of the TFT 10. At this time, the oxide semiconductor layer 15 is formed inside the perimeter of the gate electrode 12 as viewed from a direction perpendicular to the substrate plane of the TFT substrate.

In the TFT substrate of the present embodiment, the oxide semiconductor layer 15 of the peripheral circuit 90 is formed on a flat surface of the insulating layer, and is not formed on the stepped portions of the insulating layer above the perimeter of the gate electrode 12. Therefore, when forming the source electrode 17 and the drain electrode 18, the etchant for wet etching does not seep to erode the oxide semiconductor layer 15. Thus, a highly-reliable TFT substrate having a peripheral circuit 90 which reliably ensures desired characteristics can be provided.

Moreover, the position of any stepped portion of layers above the edge of the gate electrode 12 of the peripheral circuit 90, and the edge position of the oxide semiconductor layer 15, are far from the edge of the source electrode 17 and the drain electrode 18; therefore, the etchant is unlikely to intrude into the oxide semiconductor layer 15, whereby the oxide semiconductor layer 15 is prevented from erosion. Thus, a high-quality peripheral circuit 90 with little variation in performance can be provided.

Moreover, since electrical elements on the peripheral circuit 90 can be formed through production steps which are basically similar to those of an amorphous silicon TFT, the TFT substrate can be provided at low cost.

(Embodiment 7)

Next, an organic EL display device 1002 according to Embodiment 7 of the present invention will be described.

Figure 11:
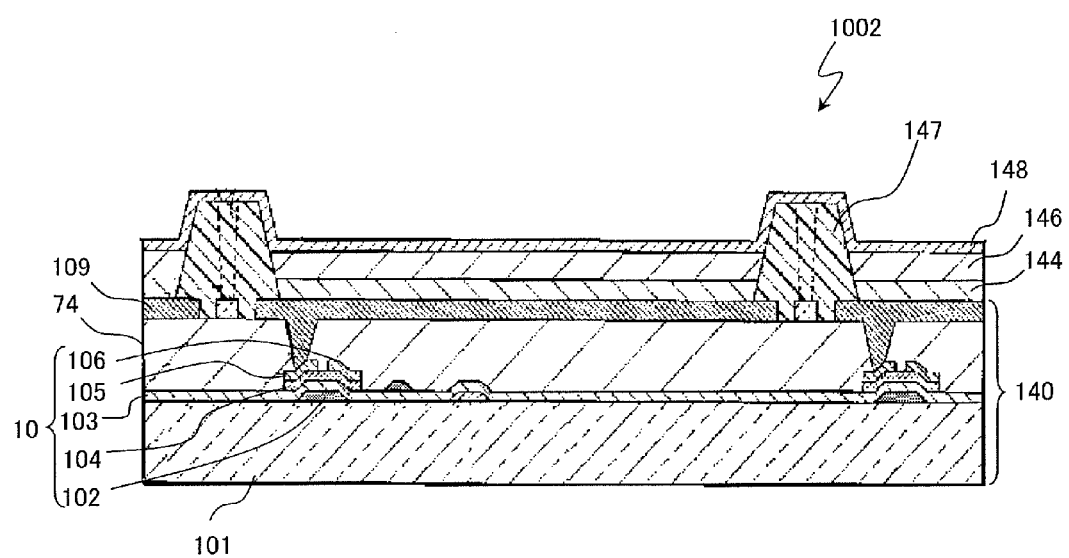
[FIG. 11] A cross-sectional view schematically showing the construction of an organic EL display device 1002 according to the present invention.
Figure 12:
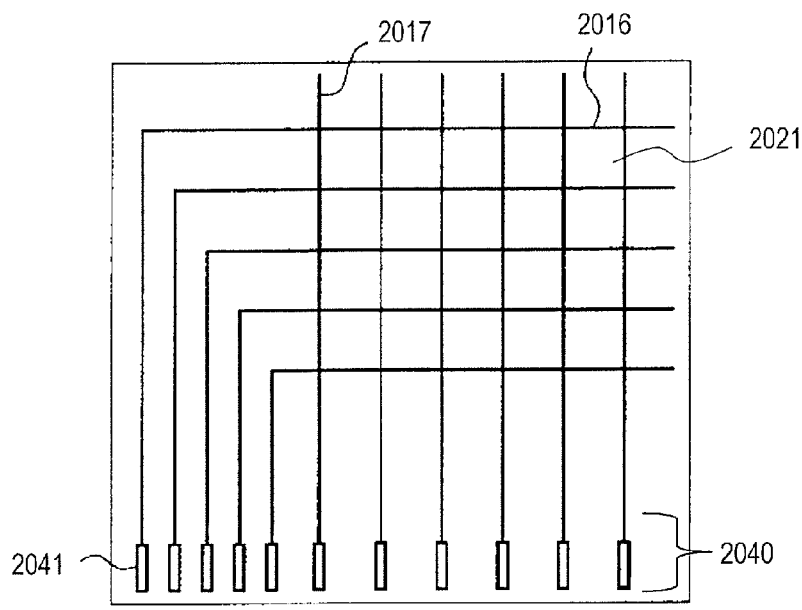
[FIG. 12] (a) is a schematic plan view generally showing a conventional TFT substrate; and (b) is an enlarged plan view showing one pixel of the TFT substrate in (a).
Figure 12:
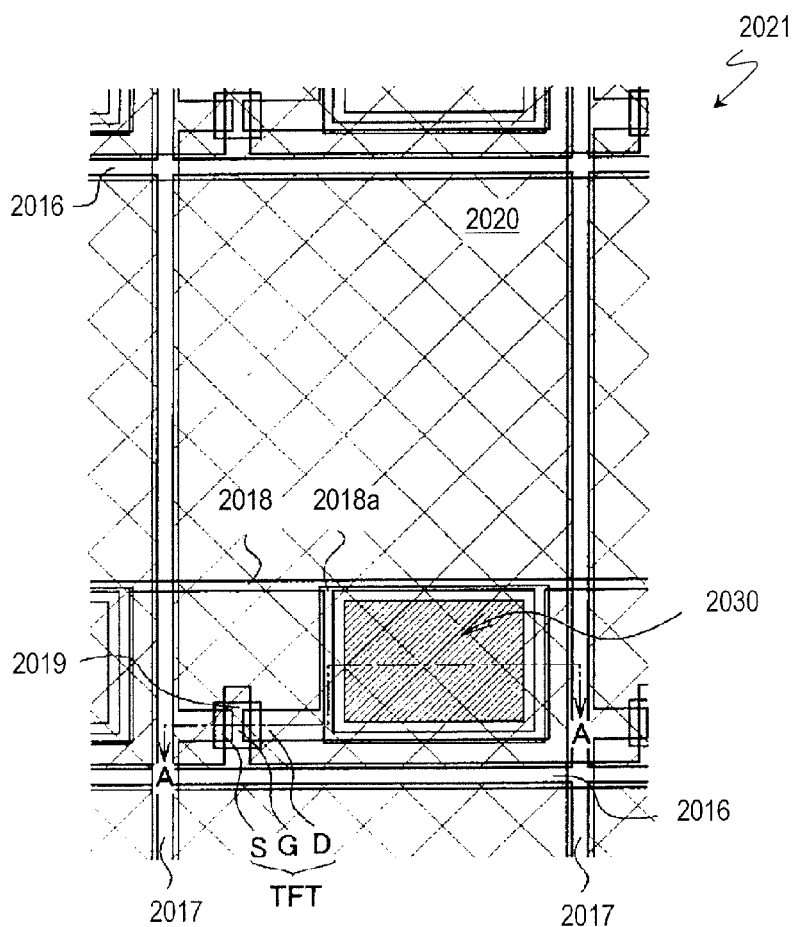
Figure 13:
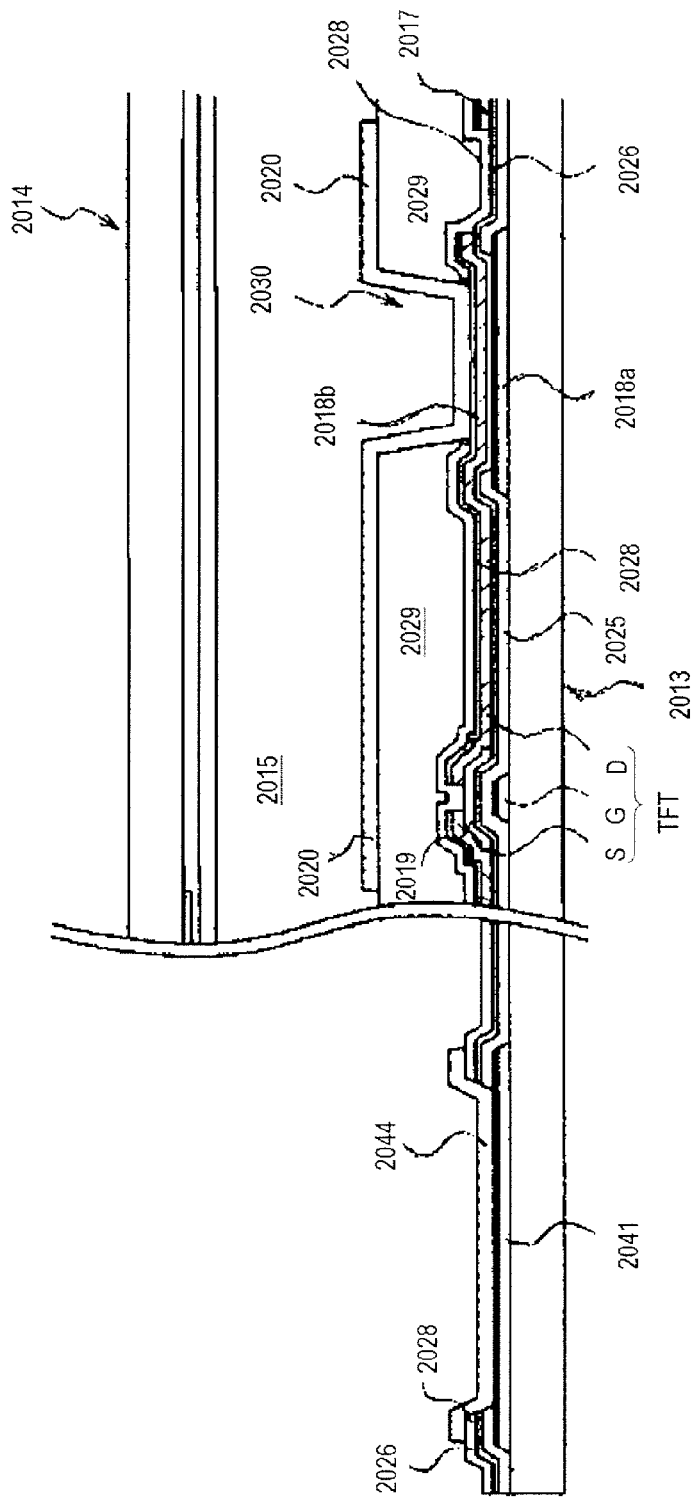
[FIG. 13] A cross-sectional view of a TFT and a terminal portion of the conventional TFT substrate shown in FIG. 12.
Figure 14:
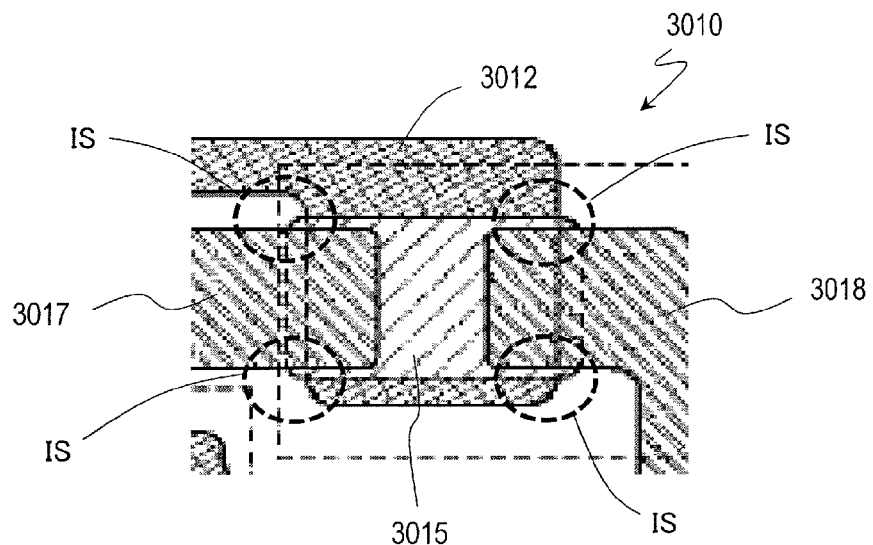
[FIG. 14] A plan view schematically showing the construction of a conventional oxide semiconductor TFT 3010.
Figure 15:
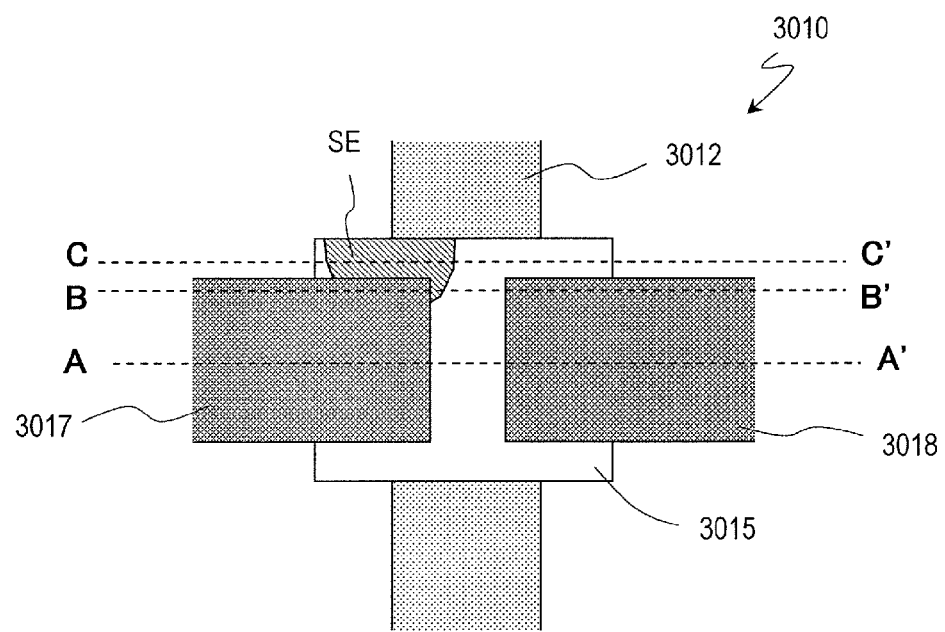
[FIG. 15] A plan view schematically showing the construction of the TFT 3010.
Figure 16:
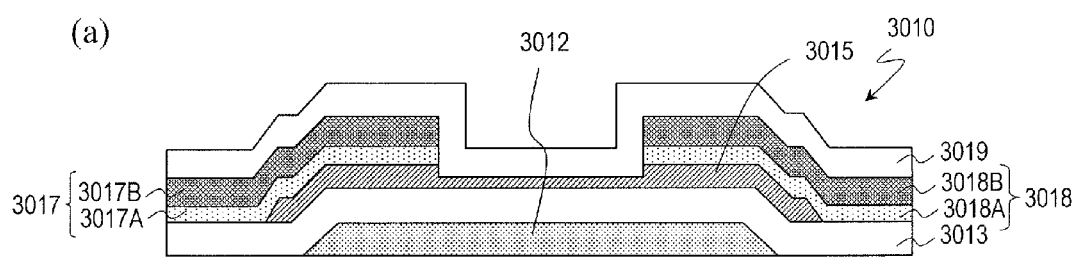
[FIG. 16] (a) is a diagram showing the construction in an A-A' cross section of the TFT 3010 in FIG. 15; (b) is a diagram showing the construction in a B-B' cross section thereof; and (c) is a diagram showing the construction in a C-C' cross section thereof.
Figure 16:
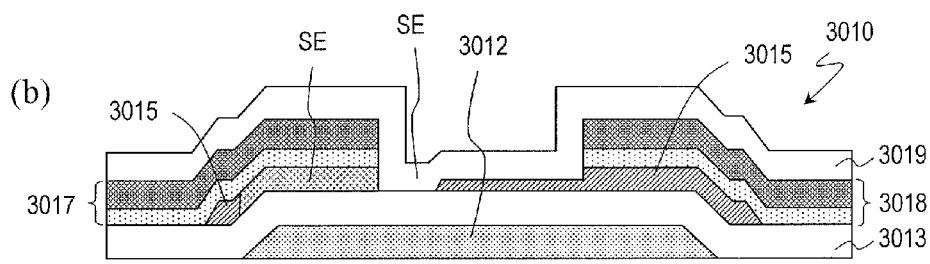
Figure 16:
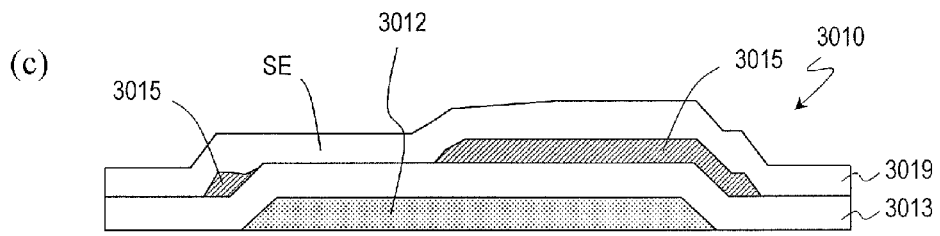
Figure 17:
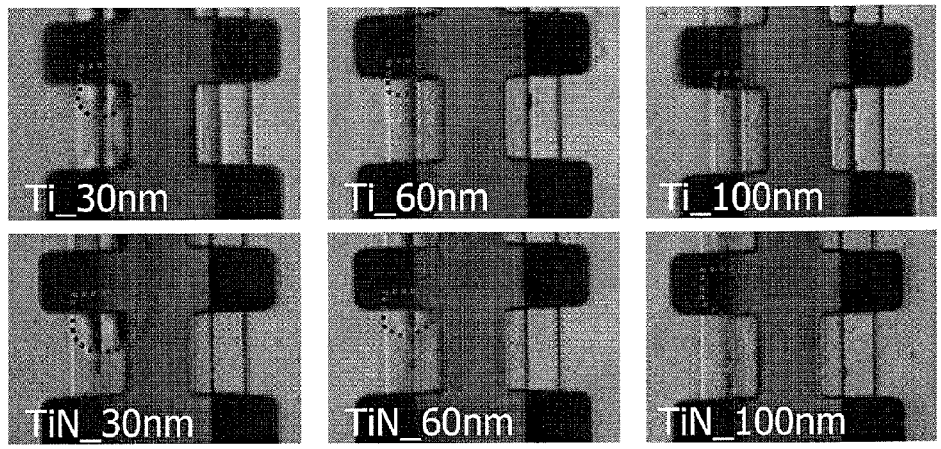
[FIG. 17] A diagram illustrating problems of the TFT 3010, where: (a) is enlarged photographs of the TFT 3010 in the cases where a titanium layer or a titanium nitride layer of varying thickness is disposed as a lower layer of a source electrode; (b) is a graph showing defect rates corresponding to such arrangements; and (c) is a cross-sectional photograph of the TFT 3010.
Figure 17:
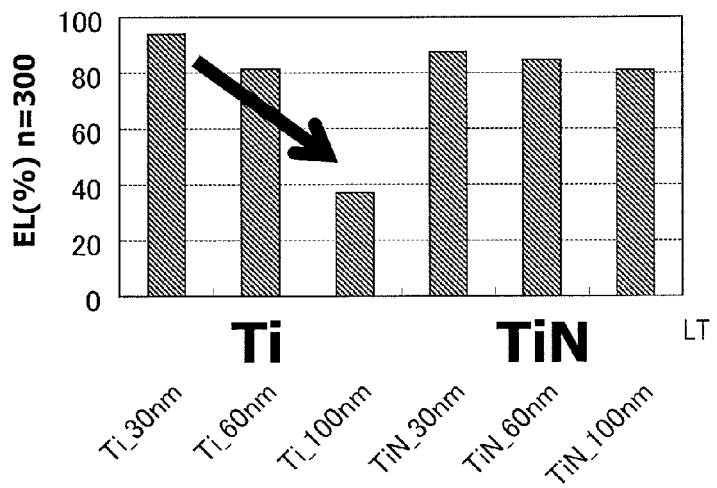
Figure 17:
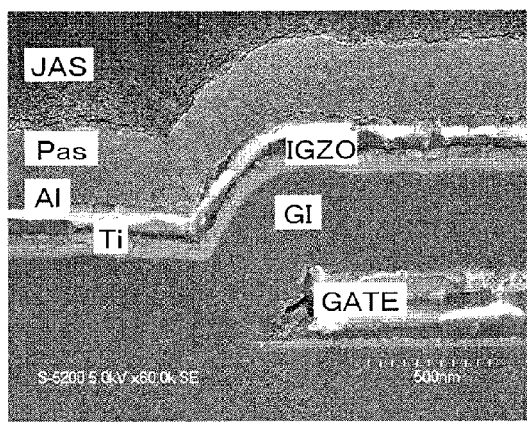

FIG. 11 is a cross-sectional view schematically showing the construction of an organic EL display device 1002 (which may be simply referred to as "display device 1002"). As shown in FIG. 11, the display device 1002 includes a TFT substrate 140, a hole transport layer 144 provided on the TFT substrate 140, a light emission layer 146 provided on the hole transport layer 144, and a counter electrode 148 provided on the light emission layer 146. The hole transport layer 144 and the light emission layer 146 constitute an organic EL layer. The organic EL layer is partitioned by insulative protrusions 147, such that each partitioned organic EL layer defines the organic EL layer of one pixel.

The TFT substrate 140 may basically have the same construction as the semiconductor devices (or TFT substrates) 100 of Embodiments 1 to 6. The TFT substrate 140 includes TFTs 10 formed on a substrate 101. The TFT substrate 140 may include a storage capacitor 60, a peripheral circuit 90, an electrical element 25, and a terminal portion 30 as described in Embodiments 1 to 6. In the exemplary TFT substrate 140 illustrated in FIG. 11, each TFT 10 includes a gate electrode 102, a gate insulating layer 103, an oxide semiconductor layer 104, a source electrode 106, and a drain electrode 105, which are formed on the substrate 101. Furthermore, the TFT substrate 140 includes an interlayer insulating layer 74 stacked so as to cover the TFTs 10 and pixel electrodes 109 which are formed on the interlayer insulating layer 74. Each pixel electrode 109 is connected to the drain electrode 105 within a contact hole which is formed in the interlayer insulating layer 74.

The planar construction of the TFT substrate 140 is basically the same as that shown in FIG. 2 and FIG. 3, and the construction of each TFT 10 is basically the same as in the embodiments described above, and therefore their descriptions are omitted. Note that the TFT substrate 140 may be implemented in a form lacking the storage capacitor 60.

When a voltage is applied across the organic EL layer by a pixel electrode 109 and the counter electrode 148, holes occurring at the pixel electrode 109 are sent via the hole transport layer 144 to the light emission layer 146. At the same time, electrons occurring at the counter electrode 148 move to the light emission layer 146, and light emission occurs in the light emission layer 146 through recombination of such holes and electrons. Desired displaying is achieved by controlling light emission in the light emission layer 146 for each pixel by using the TFT substrate 140, which is an active matrix substrate.

Known materials and structures may be employed for the materials of the hole transport layer 144, the light emission layer 146, and the counter electrode 148, and their layer structures. It is possible to provide a hole injection layer between the hole transport layer 144 and the light emission layer 146 for an improved hole injection efficiency. In order to enhance the efficiency of light emission and achieve a high electron injection efficiency into the organic EL layer, it is preferable to use a material with a high transmittance and a small work function for the counter electrode 148.

Since the TFTs 10, the storage capacitor 60, and the peripheral circuit 90 as described in Embodiments 1 to 6 are employed on the TFT substrate of the organic EL display device 1002 in the present embodiment, effects similar to those described in Embodiments 1 to 6 are obtained. According to the present embodiment, an organic EL display device 1002 capable of high-performance displaying can be provided with a good production efficiency.

Industrial Applicability

The present invention is suitably used for a semiconductor device having thin film transistors, and a display device having thin film transistors on a TFT substrate, e.g., a liquid crystal display device, an organic EL display device, or an electronic ink display device.

REFERENCE SIGNS LIST

10 TFT (thin film transistor)
11 substrate
12 gate electrode
13 gate insulating layer
15 oxide semiconductor layer
17 source electrode
18 drain electrode
19 protection layer
25 electrical element
30 terminal portion
50 pixel
52 Cs electrode
55 oxide semiconductor layer
58 Cs counter electrode
60 storage capacitor
70A, 70B diode
74 interlayer insulating layer
90 peripheral circuit
100, 140 TFT substrate (semiconductor device)
102 gate electrode
103 insulating layer (gate insulating layer)
104 oxide semiconductor layer
105 drain electrode
106 source electrode
109 pixel electrode
152 signal line
160 scanning line
162 storage capacitor line
210, 220 polarizer
230 backlight unit
240 scanning line driving circuit
250 signal line driving circuit
260 control circuit
1000 liquid crystal display device
1002 organic EL display device

The invention claimed is:

1. A TFT substrate of a display device having a thin film transistor and a storage capacitor disposed corresponding to a pixel, comprising:
   a storage capacitor electrode of the storage capacitor;
   an insulating layer arranged on the storage capacitor electrode;
   an oxide semiconductor layer disposed on the insulating layer;
   a storage capacitor counter electrode of the storage capacitor, the storage capacitor counter electrode being arranged on the oxide semiconductor layer;
   a gate electrode of the thin film transistor;
   a gate insulating layer arranged on the gate electrode;
   an oxide semiconductor layer of the thin film transistor, the oxide semiconductor layer of the thin film transistor being disposed on the gate insulating layer; and
   a source electrode and a drain electrode of the thin film transistor, the source electrode and the drain electrode being arranged on the oxide semiconductor layer of the thin film transistor, wherein,
   when viewed from a top plan view of the TFT substrate, the storage capacitor counter electrode is arranged to extend beyond an outermost perimeter of the oxide semiconductor layer as seen from the top plan view to overlap and cover at least one of a plurality of sites at which an outermost perimeter of the storage capacitor electrode and the outermost perimeter of the oxide semiconductor layer intersect; and
   when viewed from the top plan view of the TFT substrate, the source electrode or the drain electrode covers at least one of a plurality of sites at which an outermost perimeter of the gate electrode as seen from the top plan view and an outermost perimeter of the oxide semiconductor layer of the thin film transistor as seen from the top plan view intersect.

2. A TFT substrate of a display device having a thin film transistor and a storage capacitor disposed corresponding to a pixel, comprising:
   a storage capacitor electrode of the storage capacitor;
   an insulating layer arranged on the storage capacitor electrode;
   an oxide semiconductor layer disposed on the insulating layer; and
   a storage capacitor counter electrode of the storage capacitor, the storage capacitor counter electrode being arranged on the oxide semiconductor layer and including a layer of aluminum, wherein,
   when viewed from a top plan view of the TFT substrate, the oxide semiconductor layer is arranged entirely within an outermost perimeter of the storage capacitor electrode as seen from the top plan view, without intersecting the outermost perimeter of the storage capacitor electrode, and the storage capacitor counter electrode is arranged to extend beyond an outermost perimeter of the oxide semiconductor layer as seen from the top plan view to overlap and to cover an entirety of the outermost perimeter of the oxide semiconductor layer.

3. A TFT substrate of a display device having a thin film transistor and a storage capacitor disposed corresponding to a pixel, comprising:
   a storage capacitor electrode of the storage capacitor;
   an insulating layer arranged on the storage capacitor electrode;

an oxide semiconductor layer disposed on the insulating layer;

a storage capacitor counter electrode of the storage capacitor, the storage capacitor counter electrode being arranged on the oxide semiconductor layer;

a gate electrode of the thin film transistor;

a gate insulating layer arranged on the gate electrode;

an oxide semiconductor layer of the thin film transistor, the oxide semiconductor layer of the thin film transistor being disposed on the gate insulating layer; and a source electrode and a drain electrode of the thin film transistor, the source electrode and the drain electrode being arranged on the oxide semiconductor layer of the thin film transistor, wherein, when viewed from a top plan view of the TFT substrate, the storage capacitor counter electrode is arranged to extend beyond an outermost perimeter of the oxide semiconductor layer as seen from the top plan view to overlap and cover at least one of a plurality of sites at which an outermost perimeter of the storage capacitor electrode and the outermost perimeter of the oxide semiconductor layer intersect; and when viewed from the top plan view of the TFT substrate, the oxide semiconductor layer of the thin film transistor is arranged inside an outermost perimeter of the gate electrode as seen from the top plan view, without intersecting the outermost perimeter of the gate electrode as seen from the top plan view.

4. The TFT substrate of claim 1, wherein the storage capacitor counter electrode includes a layer of aluminum.

5. A production method for a TFT substrate of a display device having a thin film transistor and a storage capacitor disposed corresponding to a pixel, comprising:

(A) a step of forming a storage capacitor electrode of the storage capacitor on a substrate;

(B) a step of forming an insulating layer on the storage capacitor electrode;

(C) a step of forming an oxide semiconductor layer on the insulating layer; and (D) a step of forming a storage capacitor counter electrode of the storage capacitor on the oxide semiconductor layer, the storage capacitor counter electrode being formed from aluminum, wherein, when viewed from a top plan view of the TFT substrate, the oxide semiconductor layer is formed inside an outermost perimeter of the storage capacitor electrode as seen from the top plan view, without intersecting the outermost perimeter of the storage capacitor electrode as seen from the top plan view, and the storage capacitor counter electrode is formed to extend beyond an outermost perimeter of the oxide semiconductor layer as seen from the top plan view to overlap and to cover an entirety of the outermost perimeter of the oxide semiconductor layer as seen from the top plan view.

6. A production method for a TFT substrate of a display device having a thin film transistor and a storage capacitor disposed corresponding to a pixel, comprising:

(A) a step of forming a storage capacitor electrode of the storage capacitor on a substrate;

(B) a step of forming an insulating layer on the storage capacitor electrode;

(C) a step of forming an oxide semiconductor layer on the insulating layer; and (D) a step of forming a storage capacitor counter electrode of the storage capacitor on the oxide semiconductor layer, wherein, when viewed from a top plan view of the TFT substrate, the storage capacitor counter electrode is formed so as to extend beyond an outermost perimeter of the oxide semiconductor layer as seen from the top plan view to overlap and cover at least one of a plurality of sites at which an outermost perimeter of the storage capacitor electrode as seen from the top plan view and the outermost perimeter of the oxide semiconductor layer as seen from the top plan view intersect;

at step (A), a gate electrode of the thin film transistor is formed;

at step (C), an oxide semiconductor layer of the thin film transistor is formed on the gate electrode;

at step (D), a source electrode and a drain electrode of the thin film transistor are formed on the oxide semiconductor layer of the thin film transistor; and when viewed from the top plan view of the TFT substrate, the source electrode or the drain electrode covers at least one of a plurality of sites at which an outermost perimeter of the gate electrode as seen from the top plan view and an outermost perimeter of the oxide semiconductor layer of the thin film transistor as seen from the top plan view intersect.

7. A production method for a TFT substrate of a display device having a thin film transistor and a storage capacitor disposed corresponding to a pixel, comprising:

(A) a step of forming a storage capacitor electrode of the storage capacitor on a substrate;

(B) a step of forming an insulating layer on the storage capacitor electrode;

(C) a step of forming an oxide semiconductor layer on the insulating layer; and (D) a step of forming a storage capacitor counter electrode of the storage capacitor on the oxide semiconductor layer, wherein, when viewed from a top plan view of the TFT substrate, the storage capacitor counter electrode is formed so as to extend beyond an outermost perimeter of the oxide semiconductor layer as seen from the top plan view to overlap and cover at least one of a plurality of sites at which an outermost perimeter of the storage capacitor electrode as seen from the top plan view and the outermost perimeter of the oxide semiconductor layer as seen from the top plan view intersect;

at step (A), a gate electrode of the thin film transistor is formed;

at step (C), an oxide semiconductor layer of the thin film transistor is formed on the gate electrode;

at step (D), a source electrode and a drain electrode of the thin film transistor are formed on the oxide semiconductor layer of the thin film transistor; and when viewed from the top plan view of the TFT substrate, the oxide semiconductor layer of the thin film transistor is formed inside an outermost perimeter of the gate electrode as seen from the top plan view, without intersecting the outermost perimeter of the gate electrode as seen from the top plan view.

8. The production method for the TFT substrate of claim 6, wherein the step (D) comprises:

a step of forming an aluminum layer included in the source electrode and the drain electrode; and a step of patterning the aluminum layer via wet etching.

9. The TFT substrate of claim 1, wherein the oxide semiconductor layer is made of an In-Ga-Zn-O type semiconductor.

10. The TFT substrate of claim 2, comprising:

a gate electrode of the thin film transistor;

a gate insulating layer formed on the gate electrode;
an oxide semiconductor layer of the thin film transistor, the oxide semiconductor layer of the thin film transistor being disposed on the gate insulating layer; and
a source electrode and a drain electrode of the thin film transistor, the source electrode and the drain electrode being formed on the oxide semiconductor layer of the thin film transistor, wherein,
when viewed from the top plan view of the TFT substrate, the source electrode or the drain electrode covers at least one of a plurality of sites at which an outermost perimeter of the gate electrode as seen from the top plan view and an outermost perimeter of the oxide semiconductor layer of the thin film transistor as seen from the top plan view intersect.

11. The TFT substrate of claim 2, comprising:
a gate electrode of the thin film transistor;
a gate insulating layer formed on the gate electrode;
an oxide semiconductor layer of the thin film transistor, the oxide semiconductor layer of the thin film transistor being disposed on the gate insulating layer; and
a source electrode and a drain electrode of the thin film transistor, the source electrode and the drain electrode being formed on the oxide semiconductor layer of the thin film transistor, wherein,
when viewed from the top plan view of the TFT substrate, the oxide semiconductor layer of the thin film transistor is formed inside an outermost perimeter of the gate electrode as seen from the top plan view, without intersecting the outermost perimeter of the gate electrode as seen from the top plan view.

12. The TFT substrate of claim 2, wherein the oxide semiconductor layer is made of an In-Ga-Zn-O type semiconductor.

13. The production method for the TFT substrate of claim 6, wherein, at the step (C), the oxide semiconductor layer is made of an In-Ga-Zn-O type semiconductor.

14. The production method for the TFT substrate of claim 5, wherein,
at step (A), a gate electrode of the thin film transistor is formed;
at step (C), an oxide semiconductor layer of the thin film transistor is formed on the gate electrode;
at step (D), a source electrode and a drain electrode of the thin film transistor are formed on the oxide semiconductor layer of the thin film transistor; and
when viewed from the top plan view of the TFT substrate, the source electrode or the drain electrode covers at least one of a plurality of sites at which an outermost perimeter of the gate electrode as seen from the top plan view and an outermost perimeter of the oxide semiconductor layer of the thin film transistor as seen from the top plan view intersect.

15. The production method for the TFT substrate of claim 5, wherein,
at step (A), a gate electrode of the thin film transistor is formed;
at step (C), an oxide semiconductor layer of the thin film transistor is formed on the gate electrode;
at step (D), a source electrode and a drain electrode of the thin film transistor are formed on the oxide semiconductor layer of the thin film transistor; and
when viewed from the top plan view of the TFT substrate, the oxide semiconductor layer of the thin film transistor is formed inside an outermost perimeter of the gate electrode as seen from the top plan view, without intersecting the outermost perimeter of the gate electrode as seen from the top plan view.

16. The production method for the TFT substrate of claim 14, wherein the step (D) comprises:
a step of forming an aluminum layer included in the source electrode and the drain electrode; and
a step of patterning the aluminum layer via wet etching.

17. The production method for the TFT substrate of claim 5, wherein, at step (C), the oxide semiconductor layer is made of an In-Ga-Zn-O type semiconductor.

18. The TFT substrate of claim 1, wherein the oxide semiconductor layer is arranged separately from the thin film transistor.

19. The production method for the TFT substrate of claim 7, wherein the oxide semiconductor layer is arranged separately from the thin film transistor.

20. The production method for the TFT substrate of claim 7, wherein the step (D) comprises:
a step of forming an aluminum layer included in the source electrode and the drain electrode; and
a step of patterning the aluminum layer via wet etching.

21. The production method for the TFT substrate of claim 15, wherein the step (D) comprises:
a step of forming an aluminum layer included in the source electrode and the drain electrode; and
a step of patterning the aluminum layer via wet etching.

22. The TFT substrate of claim 3, wherein the storage capacitor counter electrode includes a layer of aluminum.

23. The TFT substrate of claim 3, wherein the oxide semiconductor layer is made of an In-Ga-Zn-O type semiconductor.

24. The TFT substrate of claim 3, wherein the oxide semiconductor layer is arranged separately from the thin film transistor.

25. The production method for the TFT substrate of claim 6, wherein, at the step (C), the oxide semiconductor layer is made of an In-Ga-Zn-O type semiconductor.

26. The production method for the TFT substrate of claim 7, wherein the oxide semiconductor layer is arranged separately from the thin film transistor.

* * * * *